(12) United States Patent
Ham et al.

(10) Patent No.: US 7,196,508 B2
(45) Date of Patent: Mar. 27, 2007

(54) HANDLER FOR TESTING SEMICONDUCTOR DEVICES

(75) Inventors: Chul Ho Ham, Gyeonggi-do (KR); Ho Keun Song, Seongnam-si (KR); Young Geun Park, Yongin-si (KR); Woo Young Lim, Seoul (KR); Jae Bong Seo, Seongnam-si (KR)

(73) Assignee: Mirae Corporation, Chungchongnam-do (KR)

( * ) Notice: Subject to any disclaimer, the term of this patent is extended or adjusted under 35 U.S.C. 154(b) by 0 days.

(21) Appl. No.: 11/196,266

(22) Filed: Aug. 4, 2005

(65) Prior Publication Data

US 2006/0214655 A1    Sep. 28, 2006

(30) Foreign Application Priority Data

Mar. 22, 2005  (KR) .................... 10-2005-0023621
Mar. 22, 2005  (KR) .................... 10-2005-0023622

(51) Int. Cl.
*R01R 31/28* (2006.01)

(52) U.S. Cl. ................................. 324/158.1
(58) Field of Classification Search ............... 324/765, 324/158.1, 760, 758; 414/225.01, 222.07, 414/222.08, 222.13; 209/573, 615
See application file for complete search history.

(56) References Cited

U.S. PATENT DOCUMENTS 6,259,247 B1 *  7/2001  Bannai .................... 324/158.1
6,522,125 B2 *  2/2003  Sagawa ................... 324/158.1
6,590,383 B2 *  7/2003  Yamashita et al. ....... 324/158.1
6,882,141 B2 *  4/2005  Kim ........................ 324/158.1

* cited by examiner

*Primary Examiner*—Ha Tran Nguyen
*Assistant Examiner*—Tung X. Nguyen
(74) *Attorney, Agent, or Firm*—Ked & Associates, LLP

(57) ABSTRACT

A handler for testing semiconductor devices is disclosed which is capable of simplifying the process carried out in an exchanging station, namely, the process of loading/unloading semiconductor devices in/from test trays, and greatly increasing the number of simultaneously testable semiconductor devices. The handler includes a loading station, an unloading station, test trays, an exchanging station comprising a horizontal moving unit for horizontally moving a selected one of the test trays by a predetermined pitch at a working place, a test station in which at least one test board having a plurality of test sockets to be electrically connected with semiconductor devices is mounted, the test station performing a test while connecting the semiconductor devices in one of the test trays, which is fed from the exchanging station to the test station, to the test sockets, device transfer units for transfer the semiconductor devices between the loading station and the exchanging station and between the exchanging station and the unloading station, respectively, and a tray transfer unit for transfer the test trays between the exchanging station and the test station.

30 Claims, 20 Drawing Sheets

HANDLER FOR TESTING SEMICONDUCTOR DEVICES

This application claims the benefit of Korean Patent Application Nos. 2004-23621 and 2004-23622, both filed on Mar. 22, 2000, which is hereby incorporated by reference as if fully set forth herein.

BACKGROUND OF THE INVENTION

1. Field of the Invention

The present invention relates to a handler for testing semiconductor devices, and more particularly, to a handler for testing semiconductor devices which connects semiconductor devices to test sockets connected to an external testing apparatus, to enable the semiconductor devices to be tested, sorts the tested semiconductor devices, based on the results of the test, and stores the sorted semiconductor devices.

2. Discussion of the Related Art

Generally, memory or non-memory semiconductor devices or modular ICs, each of which includes memory or non-memory semiconductor devices appropriately arranged on a substrate to form a circuit, are subjected to various tests after production thereof, but prior to shipment thereof. For such a test, a handler is used which automatically electrically connects semiconductor devices or modular ICs, as mentioned above, to an external testing apparatus.

Many of such handlers can not only perform a general performance test under a room temperature condition, but can also perform a high-temperature or low-temperature test after forming an extremely low or high temperature atmosphere in a sealed chamber using an electric heater or a liquefied nitrogen spray system, to determine whether or not a semiconductor device or modular IC subjected to the test can perform normal functions even under extreme temperature conditions.

Korean Patent Publication No. 10-0384622, the application of which was filed in the name of the present application, (published on May 22, 2003) discloses a handler for testing semiconductor devices, which includes a plurality of chambers configured without causing an increase in the overall size of the handler and a complexity in the structure of the handler, to enable a large amount of semiconductor devices to be efficiently tested within a short time.

The disclosed handler includes a chamber station including two chamber layers, namely, an upper chamber layer and a lower chamber layer, on each of which chambers having different functions are horizontally arranged. Each chamber layer includes a pre-heating chamber for pre-heating or pre-cooling semiconductor devices, a test chamber for performing a test for the pre-heated or pre-cooled semiconductor devices, and a defrosting chamber for returning the semiconductor devices to room temperature. In accordance with this arrangement, it is possible to test semiconductor devices of a number corresponding to two times the number of semiconductor devices simultaneously testable at one time in conventional cases.

That is, in conventional memory handlers developed prior to the above-mentioned handler of the present applicant, one test board provided with a plurality of test sockets is arranged in a single test chamber, for execution of a test. In this case, accordingly, only one test tray must be used which is connected to the test board.

On the other hand, in the handler developed by the present applicant, two test boards can be used which are mounted to respective test chambers. Accordingly, it is possible to test semiconductor devices of a number corresponding to two times the number of semiconductor devices simultaneously testable at one time in conventional cases.

Hereinafter, the test procedure carried out in the handler will be described in brief.

First, semiconductor devices loaded in user trays in a loading station are sequentially fed to an exchanging station by a picker. In the exchanging station, the fed semiconductor devices are aligned at a uniform interval by an aligner, and are then loaded in test trays made of heat-resistant metal. Thereafter, the test trays are sequentially fed to the test chamber, so that the semiconductor devices loaded in the test trays will be sequentially subjected to an electrical test. In this case, the test trays are distributed to two layers in a preheating chamber, before entering the test chamber, so that the test trays on respective layers can be connected to the test boards arranged in two layers in the test chamber, respectively, so as to be subjected to the test.

The test-completed test trays are sequentially re-fed to the exchanging station after passing through a defrosting chamber. In the exchanging station, the tested semiconductor devices of each test tray are unloaded from the test tray. The unloaded semiconductor devices are then received in associated user trays after being sorted in accordance with the results of the test.

However, the above-mentioned conventional handler has the following problems.

First, the procedure for loading/unloading semiconductor devices in/from test trays in the exchanging station is more or less complex. Also, the configuration to achieve this loading/unloading procedure is more or less complex.

That is, in the above-mentioned handler, the semiconductor device pitch in the user trays is different from the semiconductor device pitch in the test trays. For this reason, in the above-mentioned handler, the semiconductor devices carried by the user trays must be loaded in the aligner in the exchanging station so that they are aligned at a pitch corresponding to the semiconductor device pitch of the test trays. The aligner is then horizontally moved to a place where a test tray is arranged, to feed the semiconductor devices to the test tray. In order to unload semiconductor devices from a test-completed test tray, the aligner in an empty state may be moved to the test tray.

When the procedure for loading/unloading semiconductor devices in/from test trays in the exchanging station is complex, as mentioned above, the working time in the exchanging station is lengthened. As a result, the number of simultaneously testable semiconductor devices is greatly limited.

Second, typically, diverse handlers, which use different test boards with different numbers of test sockets, respectively, are manufactured by handler manufacturers to satisfy diverse demands of diverse consumers, that is, diverse semiconductor device manufacturers. However, semiconductor device manufacturers desire to use a handler, to which diverse test boards with different numbers of test sockets can be mounted (such a test board is manufactured by a tester manufacturer, and is separately mounted to a handler, for a test).

For example, although the current tendency of semiconductor device manufacturers is to require a handler which can use a plurality of test boards each provided with 128 test sockets (also, referred to as "128-para test boards"), taking into consideration the productivity in future, the semiconductor device manufacturers are also requiring a handler which can use a plurality of test boards each provided with 64 test sockets (also, referred to as "64-para test boards"). To this end, it is necessary to provide a handler compatible with both the 64-para test board and the 128-para test board.

Meanwhile, the pitch of test sockets must be varied depending on the kind of semiconductor devices to be tested. For this reason, handlers must use diverse carrier pitches because the carrier pitch of test trays is varied depending on the test socket pitch.

In conventional handlers, however, the size and structure of test trays functioning to feed semiconductor devices are standardized. Furthermore, the constituent elements of a test chamber where test boards are mounted, for example, guide rails guiding movement of test trays and a driver, cannot be varied in position. As a result, such a conventional handler is not compatible with both the 64-para test board and the 128-para test board. Thus, such a conventional handler must execute a test with a single, fixed carrier pitch.

SUMMARY OF THE INVENTION

Accordingly, the present invention is directed to a handler for testing semiconductor devices that substantially obviates one or more problems due to limitations and disadvantages of the related art.

An object of the present invention is to provide a handler for testing semiconductor devices which is capable of simplifying the process carried out in an exchanging station, namely, the process of loading/unloading semiconductor devices in/from test trays, and greatly increasing the number of simultaneously testable semiconductors.

Another object of the present invention is to provide a handler for testing semiconductor devices which enables test boards with different numbers of test sockets having different pitches to be selectively mounted to the handler, thereby being capable of achieving an enhancement in compatibility.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a handler for testing semiconductor devices comprises: a loading station in which semiconductor devices to be tested are stored; an unloading station in which tested semiconductor devices are stored after being sorted in accordance with test results of the tested semiconductor devices; test trays each provided with a plurality of carriers for temporarily holding the semiconductor devices; an exchanging station comprising a horizontal moving unit for horizontally moving a selected one of the test trays by a predetermined pitch at a working place defined in the exchanging station, the exchanging station performing a process for loading the semiconductor devices in the carriers of the test tray or unloading the semiconductor devices from the carriers of the test tray while moving the test tray by the predetermined pitch; a test station in which at least one test board having a plurality of test sockets to be electrically connected with semiconductor devices is mounted, the test station performing a test while connecting the semiconductor devices in one of the test trays, which is fed from the exchanging station to the test station, to the test sockets; device transfer units for transfer the semiconductor devices between the loading station and the exchanging station to load the semiconductor devices in the carriers of the test trays, and transfer the semiconductor devices between the exchanging station and the unloading station to unload the semiconductor devices from the carriers of the test trays, respectively; and a tray transfer unit for transfer the test trays between the exchanging station and the test station.

In another aspect of the present invention, a handler for testing semiconductor devices comprises: a loading station in which semiconductor devices to be tested are stored; an unloading station in which tested semiconductor devices are stored after being sorted in accordance with test results of the tested semiconductor devices; test trays each provided with a plurality of carriers for temporarily holding the semiconductor devices; an exchanging station comprising a vertical moving unit for vertically moving a selected one of the test trays between a standby place and a working place respectively defined at lower and upper positions in the exchanging station, and a horizontal moving unit for horizontally moving the test tray by a predetermined pitch at the working place, the exchanging station performing a process for loading the semiconductor devices in the carriers of the test tray or unloading the semiconductor devices from the carriers of the test tray while moving the test tray by the predetermined pitch; a test station in which at least one test board having a plurality of test sockets to be electrically connected with semiconductor devices is mounted, the test station performing a test while connecting the semiconductor devices in one of the test trays, which is fed from the exchanging station to the test station, to the test sockets; a plurality of buffers arranged between the loading station and the exchanging station and between the exchanging station and the unloading station, and adapted to receive the semiconductor devices to be tested and the tested semiconductor devices to allow the received semiconductor devices to be in a temporal standby state; at least one first picker which is movable between the loading station and loading ones of the buffers and between unloading ones of the buffers and the unloading station, to transfer the semiconductor devices to be tested and the tested semiconductor devices; and at least one second picker which is movable between the loading buffers and the exchanging station and between the exchanging station and the unloading buffers, to transfer the semiconductor devices to be tested and the tested semiconductor devices; first and second tray buffers arranged at opposite sides of the standby place of the exchanging station, respectively; tray shifters each adapted to horizontally transfer the test tray between the exchanging station and an associated one of the first and second tray buffers; and a tray transfer unit for transfer the test trays between the exchanging station and the test station.

In accordance with the present invention, the process of loading/unloading semiconductor devices in/from a test tray is carried out while the test tray is horizontally moved by a predetermined pitch in the exchanging station. Accordingly, the loading/unloading process can be very simplified. Also, the processing rate is enhanced. Accordingly, it is possible to simultaneously test a number of semiconductor devices. In addition, the configuration of the exchanging station is simple.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Figure 1:
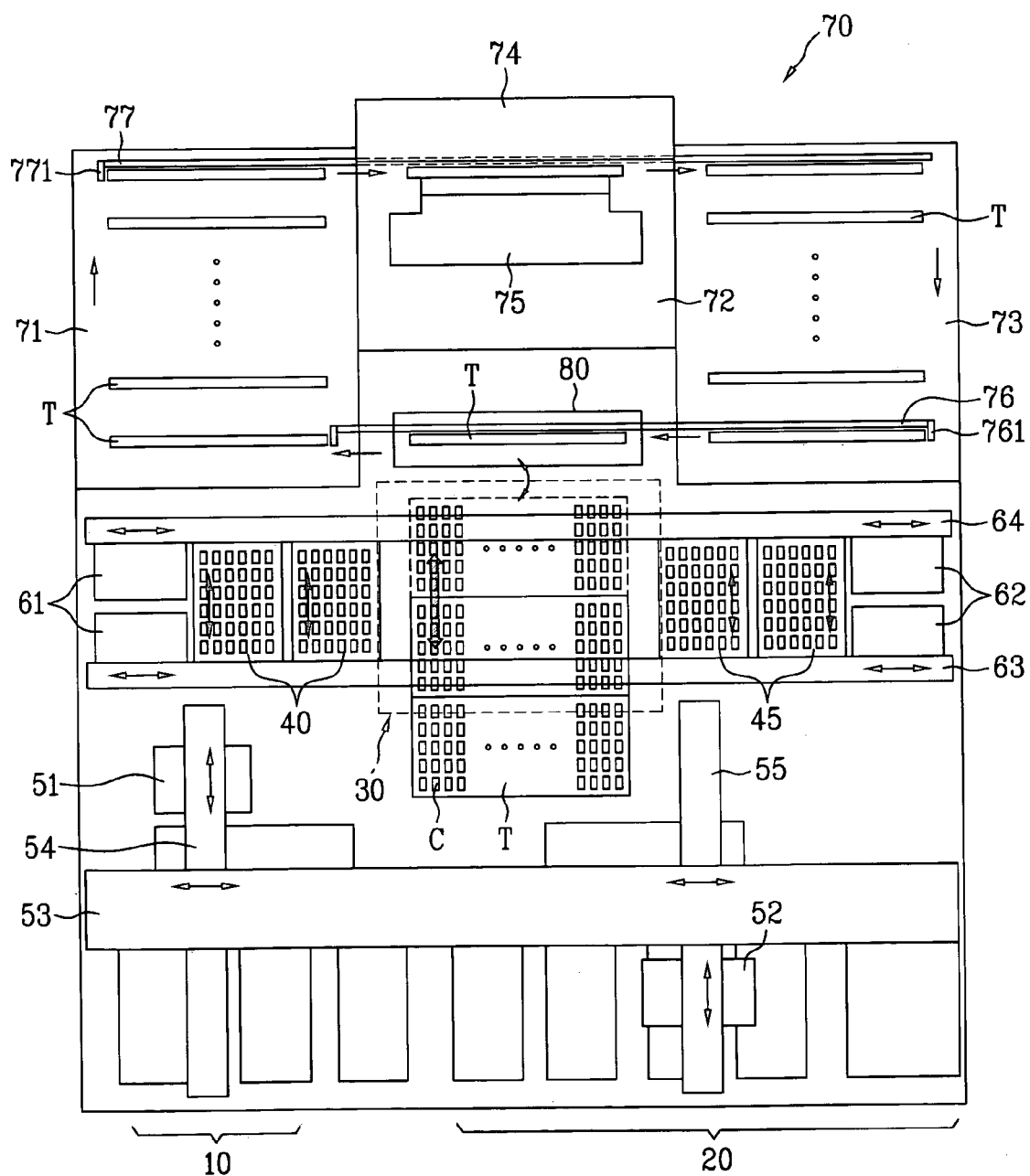
FIG. 1 is a plan view schematically illustrating a handler for testing semiconductor devices in accordance with an embodiment of the present invention.

Reference will now be made in detail to the preferred embodiments of the present invention, examples of which are illustrated in the accompanying drawings. Wherever possible, the same reference numbers will be used throughout the drawings to refer to the same or like parts.

FIGS. 1 to 4 schematically illustrate a handler for testing semiconductor devices in accordance with an embodiment of the present invention. The handler includes a loading station 10 arranged at a front part of the handler. User trays, in which a plurality of semiconductor devices to be tested are received, are stacked in the loading station 10. The handler also includes an unloading station 20 arranged at one side of the loading station 10. In the unloading station 20, semiconductor devices, which have been tested, are sorted in accordance with the results of the test, and are then received in user trays arranged in the unloading station 20 in accordance with the results of the sorting.

A plurality of buffers 40 and 45 are arranged at opposite sides of an intermediate part of the handler, respectively, such that the buffers 40 and 45 are forwardly and rearwardly movable by a buffer moving unit (not shown). Semiconductor devices fed from the loading station 10 are temporarily seated on the buffers 40 and 45 to await a subsequent process. An exchanging station 30 is arranged between the buffers 40 and the buffers 45. Performed in the exchanging station 30 are a process for transfer the semiconductor devices, to be tested, from the buffers 40 and 45 to test trays T, and re-loading the fed semiconductor devices in the test trays T, and a process for unloading the semiconductor devices, which have been tested, from the test trays T. Each test tray T includes a plurality of carriers C adapted to temporarily carry semiconductor devices, respectively. The carriers C are arranged in multiple rows.

In the illustrated embodiment, one pair of the buffers 40 and one pair of the buffers 45 are arranged at opposite sides of the exchanging station 30, respectively. The pitch of the semiconductor devices seated on each of the buffers 40 and 45 is identical to the pitch of the semiconductor devices respectively loaded in the carriers C of each test tray T. The buffers 40 and 45 may be distributed to have different functions such that one of each buffer 40 and 45 functions as a loading buffer for receiving only the semiconductor devices to be tested, and the other one of each buffer 40 and 45 functions as an unloading buffer for receiving only the tested semiconductor devices. Also, each buffer may receive both the semiconductor devices to be tested and the tested semiconductor devices.

In the illustrated embodiment, the buffers 40 arranged near the loading station 10 are designated as loading buffers 40, whereas the buffers 45 arranged near the unloading station 20 are designated as unloading buffers.

A first loading/unloading picker 51 and a second loading/unloading picker 52 are arranged over the front part of the handler at the sides of the loading and unloading stations 10 and 20, respectively. The first and second loading/unloading pickers 51 and 52 transfer semiconductor devices while horizontally moving between the loading station 10 and each buffer 40 and between the unloading station 20 and each buffer 45, respectively. A first X-axis frame 53 is arranged over the front part of the handler. The first X-axis frame 53 extends along the loading and unloading stations 10 and 20 in a lateral direction (hereinafter, referred to as an "X-axis direction"). Movable frames 54 and 55 are mounted to the first X-axis frame 53 such that the movable frames 54 and 55 are independently movable along the first X-axis frame 53. The first and second loading/unloading pickers 51 and 52 are mounted to the movable frames 54 and 55 such that the first and second loading/unloading pickers 51 and 52 are horizontally movable in a Y-axis direction perpendicular to the X-axis direction along the movable frames 54 and 55, respectively.

Although not shown, linear motors may be used for drive units adapted to horizontally move the movable frames 54 and 55 and the first and second loading/unloading pickers 51 and 52. However, well-known linear driving systems such as a system including ball screws and servo motors, or a system including pulleys, belts, and servo motors may also be used.

It is preferred that each of the first and second loading/unloading pickers 51 and 52 be configured to transfer a plurality of semiconductor devices in a state of simultaneously vacuum-attracting the semiconductor devices. It is also preferred that each of the first and second loading/ unloading pickers 51 and 52 be configured to vary the pitch of semiconductor devices between the pitch of semiconductor devices in each user tray and the pitch of semiconductor devices in each of the buffers 40 and 45.

A plurality of short pickers 61 and 62 are arranged over the intermediate part of the handler such that each of the short pickers 61 and 62 is horizontally movable in the X-axis direction, to transfer semiconductor devices between the exchanging station 30 and an associated one of the buffers 40 and 45. In the illustrated embodiment, four short pickers are arranged such that two short pickers 61 and two short pickers 62 are arranged at opposite sides of the intermediate part of the handler, respectively. A second X-axis frame 63 and a third X-axis frame 64 are arranged over the intermediate part of the handler while being appropriately spaced apart from each other in the Y-axis direction. The short pickers 61 are mounted to the second and third X-axis frames 63 and 64, to be horizontally movable along the second and third X-axis frames 63 and 64 in the X-axis direction, respectively. Similarly, the short pickers 62 are mounted to the second and third X-axis frames 63 and 64, to be horizontally movable along the second and third X-axis frames 63 and 64 in the X-axis direction, respectively. In the illustrated embodiment, the short pickers 61 arranged at the left side of FIG. 1 are designated as loading short pickers, whereas the short pickers 62 arranged at the right side of FIG. 1 are designated as unloading short pickers.

Each of the short pickers 61 and 62 may be configured to be movable along an associated one of the second and third X-axis frames 63 and 64 by a linear motor (not shown) or a well-known linear driving system including, for example, a ball screw and a servo motor.

A test station 70 is arranged at the rear part of the handler. The test station 70 includes a plurality of divided sealed chambers. The test station 70 forms a high-temperature or low-temperature atmosphere in each chamber, and tests semiconductor devices in the formed atmosphere while sequentially transfer the test trays T, in which the semiconductor devices are loaded, into the chamber. In the illustrated embodiment, the chambers of the test station 70 are arranged in two layers such that two test trays T can be simultaneously tested.

The configuration of the test station 70 will be described in more detail hereinafter. The test station 70 mainly includes a preheating chamber 71, a test chamber 72, and a defrosting chamber 73, which are arranged on each chamber layer of the test station 70.

Each preheating chamber 71 sequentially transfers test trays T fed from the exchanging station 30 in a rearward direction stepwise, while heating or cooling the semiconductor devices loaded in each test tray T at a predetermined heating or cooling temperature. Each test chamber 72 mounts the semiconductor devices in each of the test trays, sequentially fed from the associated preheating chamber 71, to test sockets (not shown) coupled to external test equipment (not shown), thereby enabling the semiconductor devices to be subjected to an electrical performance test. Each defrosting chamber 73 sequentially transfers test trays T fed from the associated test chamber 72 in a forward direction stepwise, while returning the tested semiconductor devices loaded in each test tray T to an initial room temperature state.

Test boards 74 are arranged the test chambers 72, respectively. That is, the test boards 74 are arranged in two layers.

Figure 2:
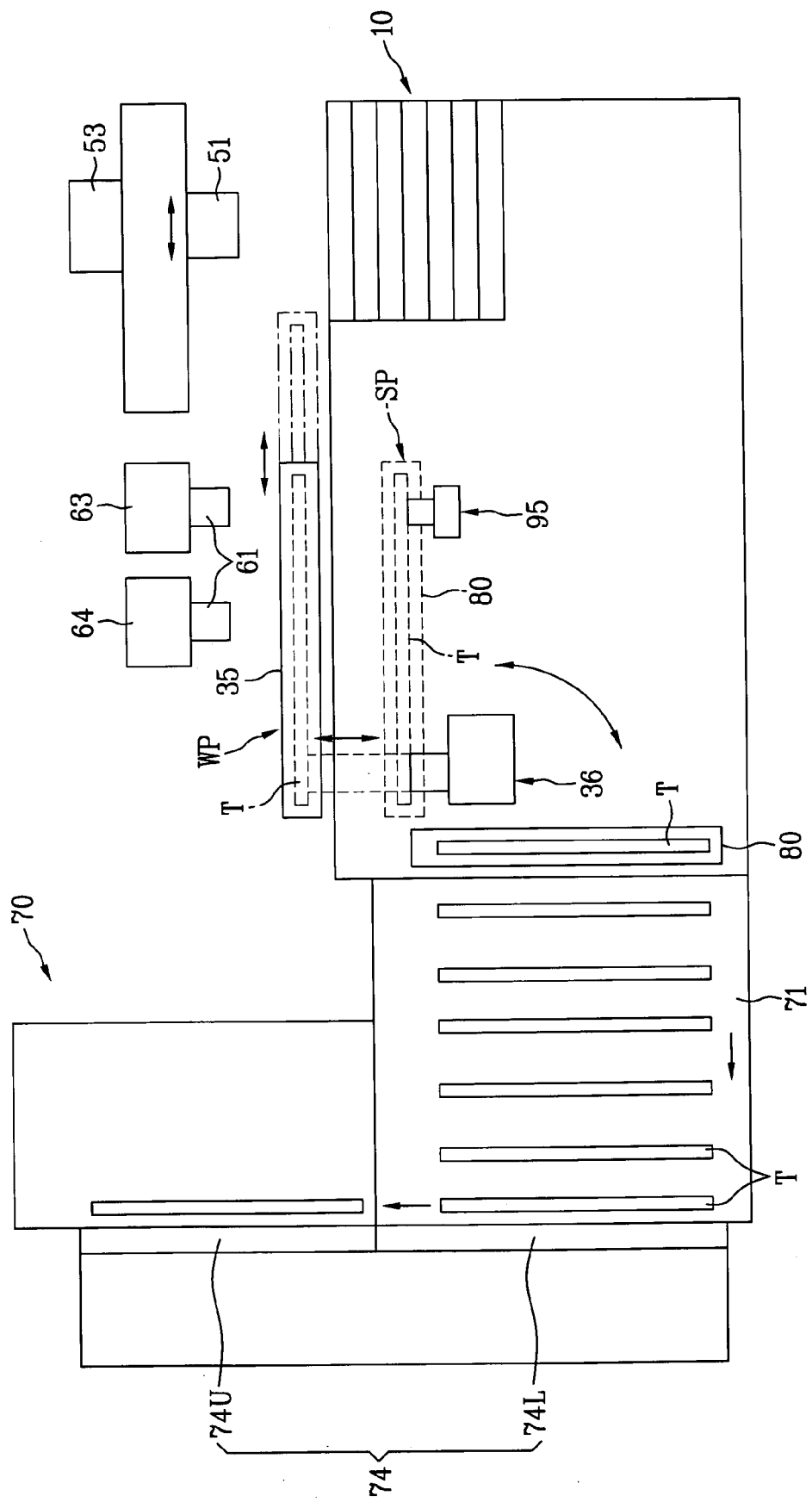
FIG. 2 is a schematic side view of the handler shown in FIG. 1.

Each test board 74 includes a plurality of test sockets (not shown). In FIG. 2, the upper test board is designated by "74U", and the lower test board is designated by "74L".

An elevator (not shown) is arranged at a rear end of each of the preheating and defrosting chambers 71 and 73, in order to distribute a test tray T fed to the rear end of the associated chamber while vertically moving the test tray T.

A front transfer unit 76 is arranged at the front of the test station 70. The front transfer unit 76 functions to transfer a test tray T discharged from the exchanging station 30 to one of the preheating chambers 71, and to transfer a test tray T discharged from one of the defrosting chambers 73 to the exchanging station 30. A rear transfer unit 77 is arranged at the rear of the test station 70. The rear transfer unit 77 functions to transfer a test tray T discharged from one of the preheating chambers 71 to one of the test chambers 72, and to transfer test tray T discharged from one of the test chambers 72 to one of the defrosting chambers 73.

In the illustrated embodiment, since the test station 70 includes two chamber layers each including one preheating chamber 71, one test chamber 72, and one defrosting chamber 73, it is preferred that the handler include two independent front transfer units 76 respectively arranged in two layers corresponding to the two chamber layers, and two independent rear transfer units 77 respectively arranged in two layers corresponding to the two chamber layers.

Each front transfer unit 76 includes a holder 761 for holding one end of a test tray T reaching the front transfer unit 76, and a linear driver (not shown) for linearly moving the holder 761. Similarly, each rear transfer unit 77 includes a holder 771 for holding one end of a test tray T reaching the rear transfer unit 77, and a linear driver (not shown) for linearly moving the holder 771. The linear driver may comprise a well-known system including a ball screw and a servo motor, or a linear motor.

A contact unit 75 is arranged in each test chamber 72 such that the contact unit 75 is movable in the Y-axis direction. When one test tray T is aligned with the test board 74 in the test chamber 72 associated with the contact unit 75, the contact unit 75 presses the test tray T against the test board 74 to connect the semiconductor devices of the test tray T to the test board 74.

In the test station 70, each test tray T is fed in an upright or vertical state. On the other hand, in the exchanging station 30, the process of loading semiconductor devices in a test tray T and the process of unloading semiconductor devices from a test tray T are carried out under the condition in which the test trays T are maintained in a horizontal state. To this end, a rotator 80 is arranged between the front end of the test station 70 and the exchanging station 30 such that the rotator 80 is pivotable through an angle of 90° to transfer a test tray T while changing the test tray T between a horizontal state and a vertical state, as shown in FIG. 2.

Meanwhile, in the exchanging station 30, test tray transfer processes are carried out at two positions, respectively. That is, at an upper working place WP, the semiconductor device loading and unloading processes are carried out while horizontally moving semiconductor devices by a predetermined pitch under the condition in which the semiconductor devices are horizontally maintained. On the other hand, at a lower standby place SP beneath the working place WP, a process for transferring a test tray T between the test station 70 and the exchanging station 30 is carried out using the rotator 80.

At least one vertical moving unit 36 is arranged in the exchanging station 30, to vertically move the test tray T received in the exchanging station 30 between the standby place SP and the working place WP, as shown in FIG. 2.

A horizontal moving unit 35 is also arranged at the working place WP of the exchanging station 30, to horizontally move the test tray T received in the exchanging station 30 by the predetermined pitch.

Figure 3:
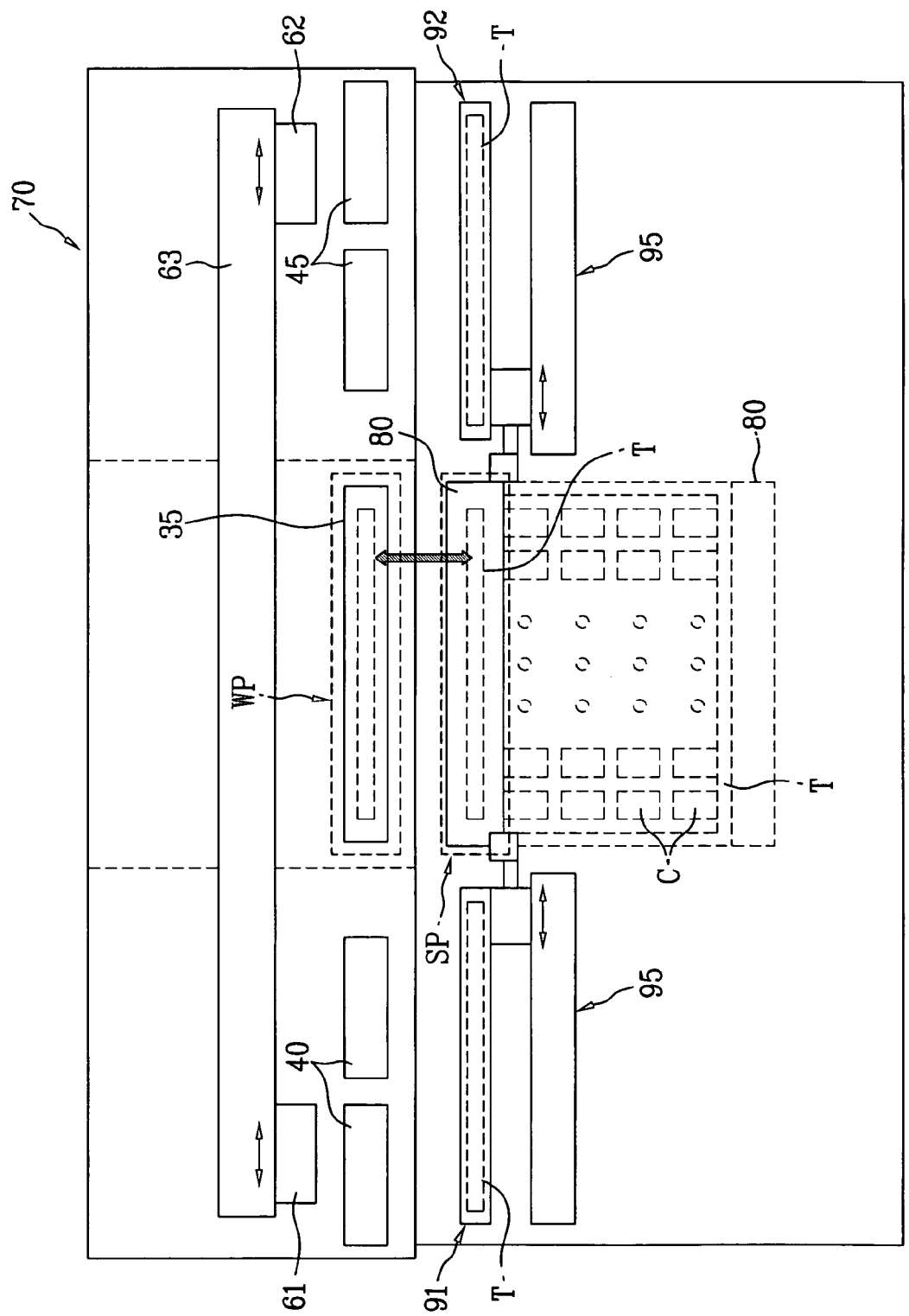
FIG. 3 is a schematic front view of the handler shown in FIG. 1.

As show in FIG. 3, a first tray buffer 91 and a second tray buffer 92 are arranged at opposite sides of the standby place SP in the exchanging station 30, respectively. Each of the first and second tray buffers 91 and 92 receives a test tray T, and holds the test tray T in temporary standby state. A pair of guide members (not shown) is arranged at each of the first and second buffers 91 and 92 such that the guide members support upper and lower edges of the test tray T received in the associated buffer while allowing the test tray T to move slidably.

Tray shifters 95 are arranged beneath the exchanging station 30 to transfer test trays T while horizontally reciprocating between the standby place SP and the first tray buffer 91 and between the standby place SP and the second tray buffer 92, respectively.

Hereinafter, the configurations of the main elements included in the handler will be described in more detail.

Figure 5:
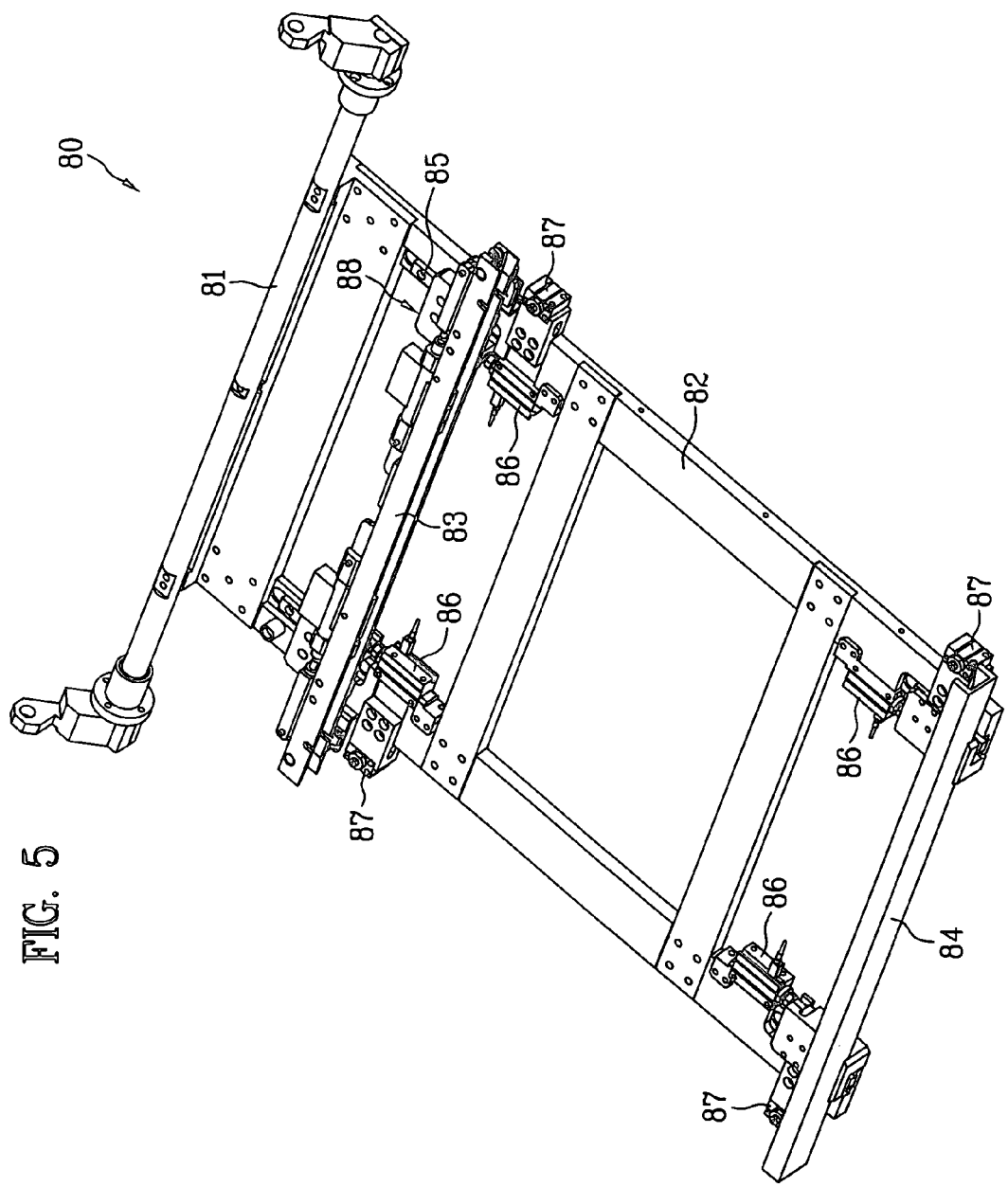
FIG. 5 is a perspective view illustrating a configuration of a rotator included in the handler of FIG. 1.
Figure 6:
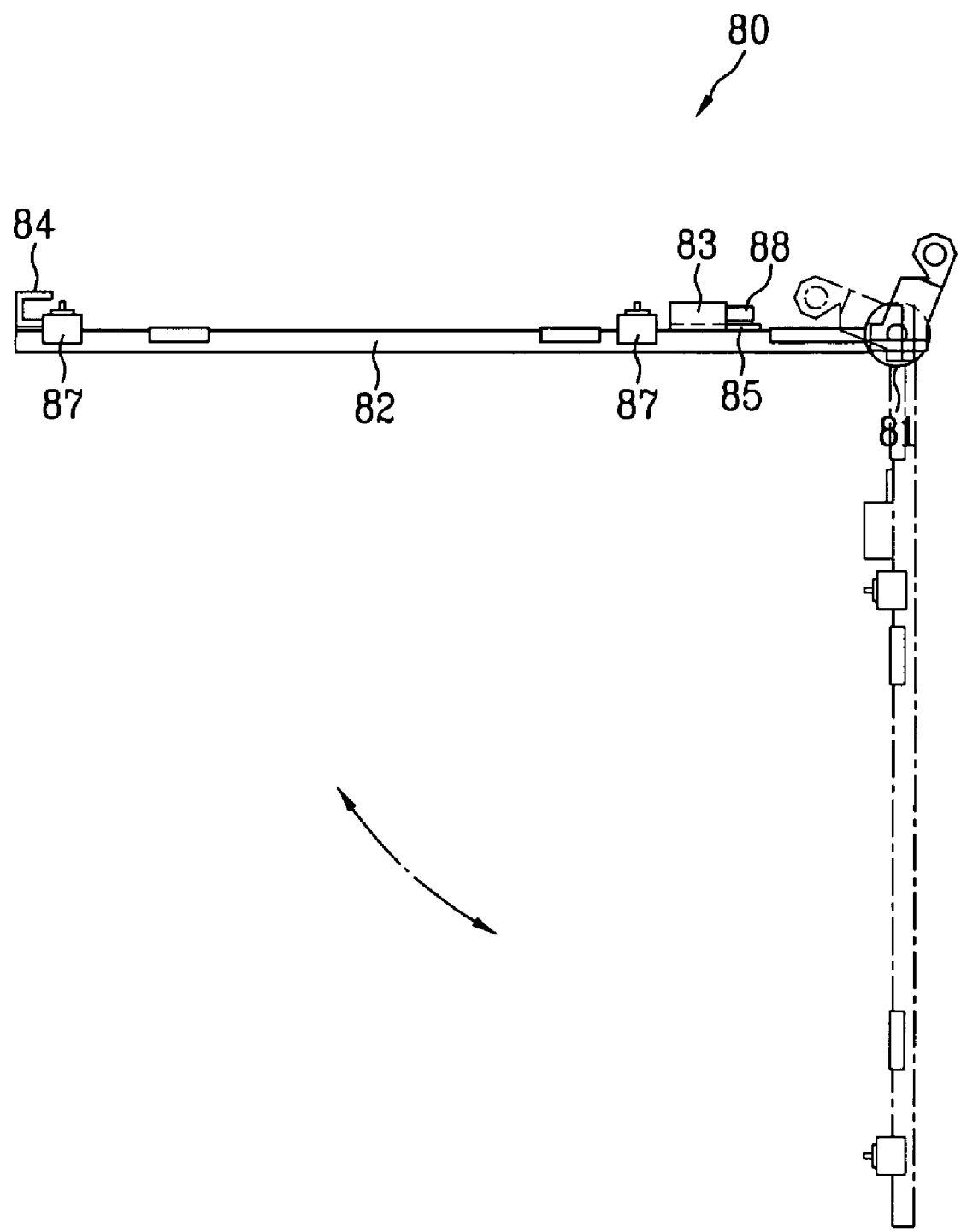
FIG. 6 is a schematic side view of the rotator shown in FIG. 5.

First, an embodiment of the rotator 80 will be described in detail with reference to FIGS. 5 to 7.

The rotator 80 includes a rotating shaft 81 connected at opposite ends thereof to pneumatic cylinders (not shown), respectively, such that the rotating shaft 81 is rotatable, and a frame 82 coupled at an upper end thereof to the rotating shaft 81 such that the frame 82 is pivotable in accordance with rotation of the rotating shaft 81. The rotator 80 also includes a U-shaped upper guide rail 83 mounted to an upper portion of the frame 82 such that the upper guide rail 83 is vertically movable, and adapted to support the upper edge of a test tray T received in the rotator 80, a U-shaped lower guide rail 84 mounted to a lower portion of the frame 82 such that the lower guide rail 84 is vertically movable, and adapted to support the lower edge of the test tray T received in the rotator 80, and a pair of holders 88 respectively mounted to the upper guide rail 83 at opposite sides of the upper guide rail 83, and adapted to hold or release the test tray T.

The upper guide rail 83 is slidably coupled to linear motion guides 85 respectively mounted to an upper portion of the frame 82 at opposite sides of the frame 82 such that the upper guide rail 83 extends vertically. Similarly, the lower guide rail 84 is slidably coupled to linear motion guides 85 respectively mounted to a lower portion of the frame 82 at opposite sides of the frame 82 such that the lower guide rail 84 extends vertically. Each of the upper and lower guide rails 83 and 84 are connected to first pneumatic cylinders 86 to slide vertically along the associated linear motion guides 85 in accordance with operation of the first pneumatic cylinders 86, and thus, to hold or release the test tray T received in the rotator 80.

A plurality of second pneumatic cylinders 87 are mounted to the frame 82 at opposite sides of the frame 82. The second pneumatic cylinders 87 support the test tray T received in the rotator 80 when the frame 82 is horizontally positioned, and at the same time, the upper and lower guide rails 83 and 84 slide to release the test tray T. The second pneumatic cylinders 87 also functions to vertically move the test tray T in a state in which the test tray T is horizontally supported by the second pneumatic cylinders 87.

Figure 7:
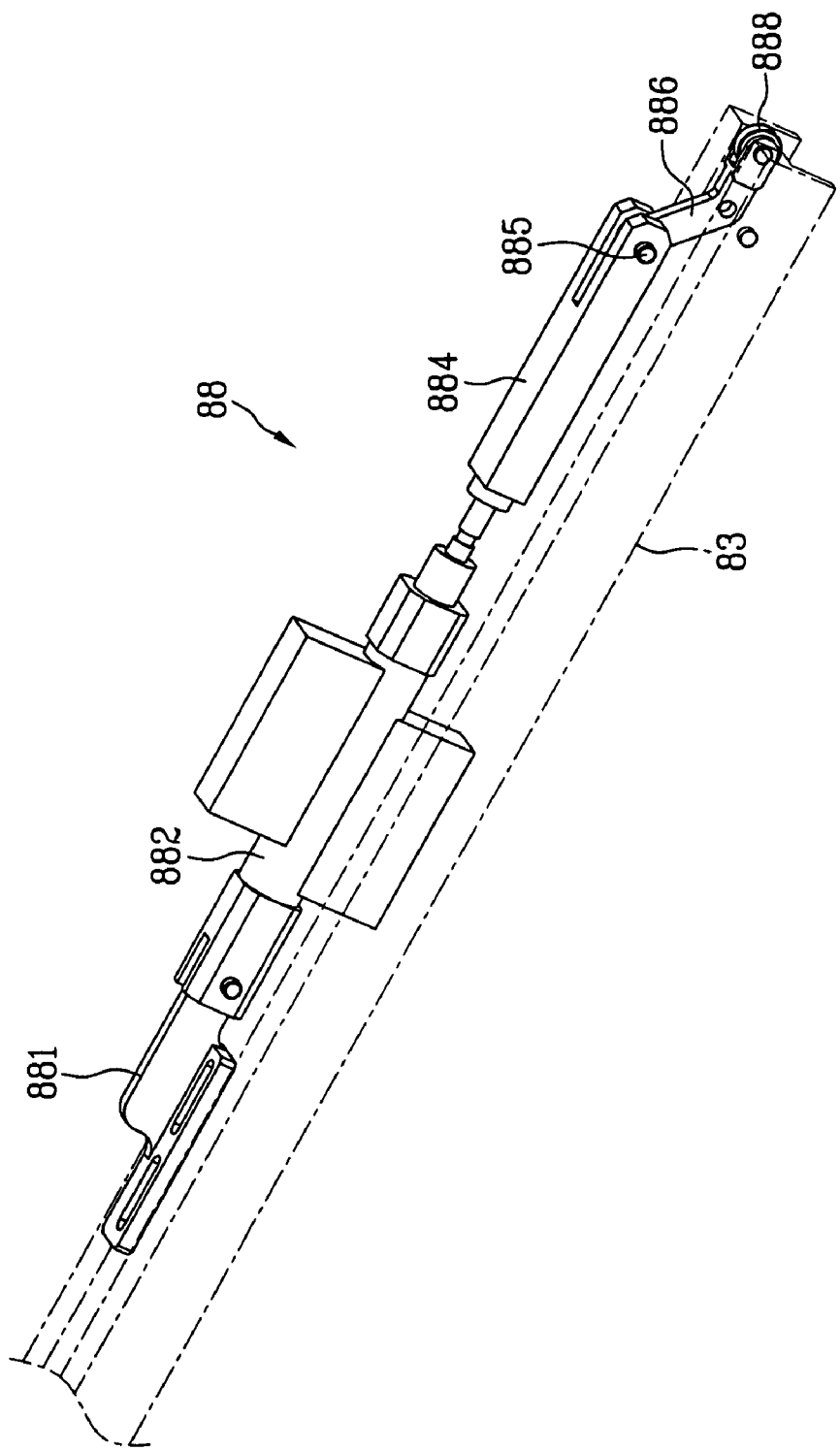
FIG. 7 is a perspective view illustrating a configuration of a holder included in the rotator of FIG. 5.

As shown in FIG. 7, each holder 88 includes a cylinder block 881 fixed to the upper guide rail 83, a pneumatic cylinder 882 fixed to the cylinder block 881, a holder bar 886 connected at one end thereof to an outer end of a piston rod 884 included in the pneumatic cylinder 882 by means of a hinge pin 885, and pivotally connected at an intermediate portion thereof to the upper guide rail 83, and a roller 888 freely rotatably mounted to the other end of the holder bar 886.

When the piston rods 884 extend outwardly from the associated pneumatic cylinders 882 of the holders 88 in accordance with operation of the pneumatic cylinders 882, the holder bars 886 are pivotally moved toward the inside of the upper guide rail 83, thereby causing the rollers 888 to hold opposite lateral edges of the test tray T received in the rotator 80, respectively. On the other hand, when the piston rods 884 retract inwardly into the associated pneumatic cylinders 882 of the holders 88, the holder bars 886 are pivotally moved toward the outside of the upper guide rail 83, so that the rollers 888 are moved away from each other, thereby allowing the test tray T to be laterally movable along the upper and lower guide rails 83 and 84.

Figure 8:
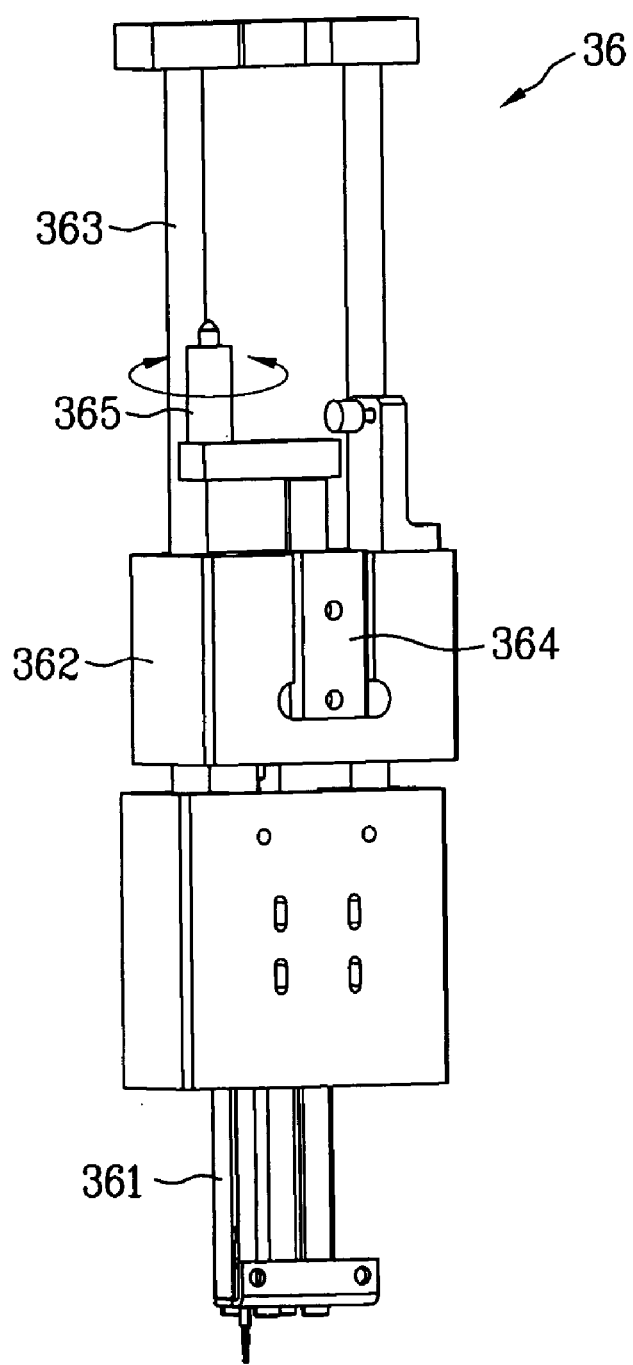
FIG. 8 is a perspective view illustrating a vertical moving unit included in the handler of FIG. 1.

Next, an embodiment of the vertical moving unit 36 will be described with reference to FIG. 8.

The vertical moving unit 36 includes a pneumatic cylinder 361 fixedly arranged beneath the standby place SP of the exchanging station 30, a movable block which is vertically movable by the pneumatic cylinder 361, and a guide shaft 363 for guiding movement of the movable block 362. The vertical moving unit 36 also includes a holder 365 mounted to the movable block 362 such that the holder 365 can be inserted into an insert hole (not shown) formed at an edge portion of the test tray T received in the exchanging station 30, and adapted to hold or release the test tray T. It is preferred that the handler include a plurality of vertical moving units 36 arranged at opposite sides of the standby place SP to face each other.

A rotary cylinder 364 is also mounted to the movable block 362 of each vertical moving unit 36, to turn the associated holder 365 through 90°. The reason why the holder 365 of each vertical moving unit 36 is turned through 90° is to prevent the holder 365 from interfering with rotation of the rotator 80 (FIG. 5) in a state in which the holder 365 does not hold the test tray T. That is, when the holder 365 is still positioned just beneath the test tray T even though the holder 365 does not hold the test tray T, the rotator 80 cannot pivot downwardly. Accordingly, when the rotator 80 is to rotate, the holder 365 is positioned outside the pivoting trace of the rotator 80.

Each vertical moving unit 36 having the above-described configuration operates as follows. When a test tray T to be elevated is positioned at the standby place SP, the holder 365 of the vertical moving unit 36 is turned 90° by the rotary cylinder 364, so that the holder 365 is positioned just beneath the associated insert hole (not shown) of the test tray T. In this state, the pneumatic cylinder 361 operates subsequently to upwardly move the movable block 362 along the guide shaft 363, thereby causing the holder 365 to be inserted into the associated insert hole of the test tray T. In accordance with further upward movement of the movable block 362, the test tray T is raised to the working place WP. Of course, when the test tray T is to be lowered from the working place WP, the vertical moving unit 36 operates in an order reverse to that of the above-described procedure.

Hereinafter, an embodiment of the horizontal moving unit 35 will be described with reference to FIGS. 9 and 10.

Figure 9:
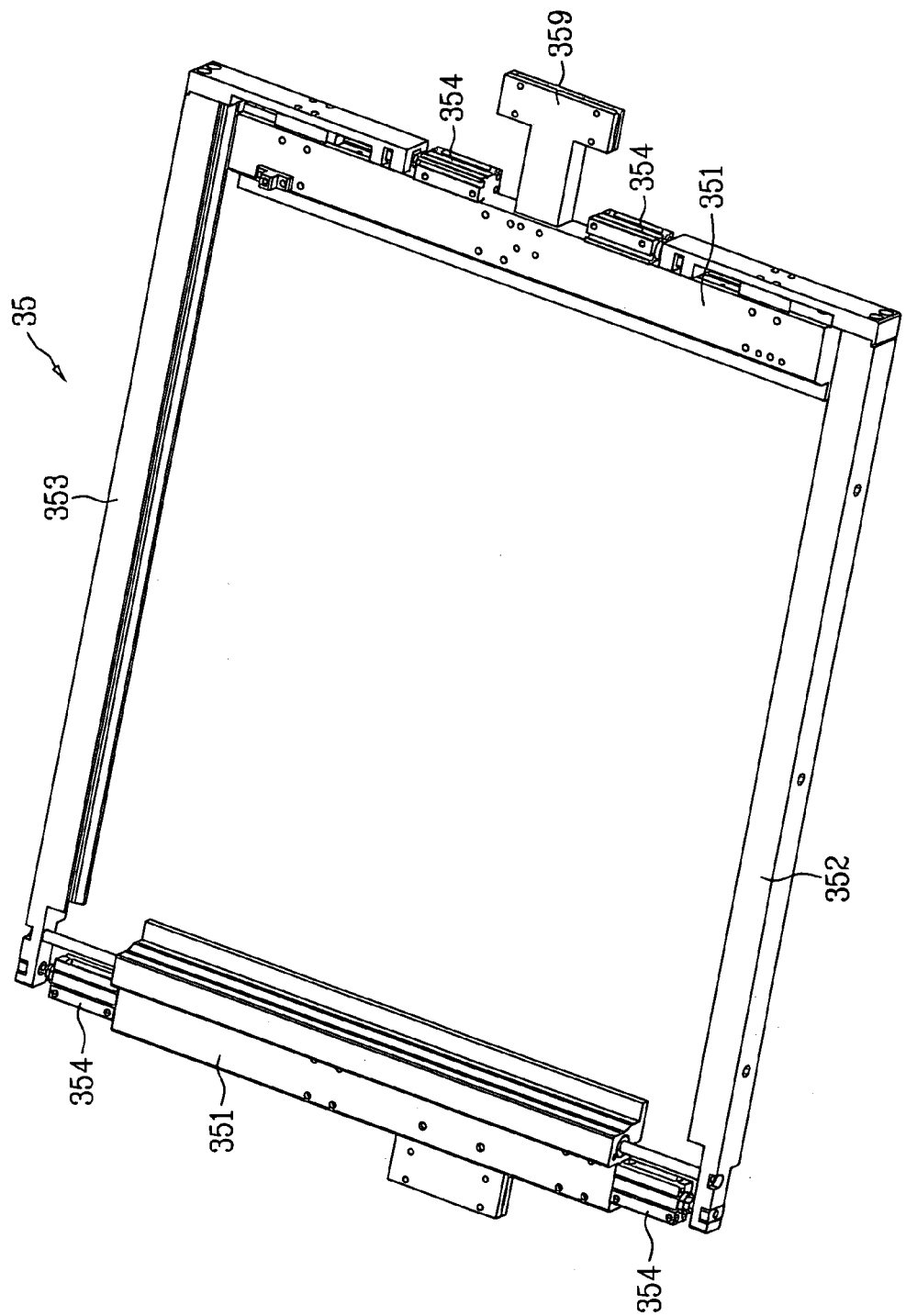
FIGS. 9 and 10 are a perspective view and a schematic side view illustrating a horizontal moving unit included in the handler of FIG. 1, respectively.

As shown in FIG. 9, the horizontal moving unit 35 includes a pair of movable blocks 351 which are movable along guide rails 355 (FIG. 10) arranged at the exchanging station 30 to extend in the Y-axis direction. The horizontal moving unit 35 also includes a front holder 352 mounted at opposite ends thereof to respective front ends of the movable blocks 351 such that the front holder 352 is movable in the Y-axis direction, and adapted to hold the front or lower edge of the test tray T received in the exchanging station 30, a rear holder 353 mounted at opposite ends thereof to respective rear ends of the movable blocks 351 such that the rear holder 353 is movable in the Y-axis direction, and adapted to hold the rear or upper edge of the test tray T. The horizontal moving unit 35 further includes a plurality of pneumatic cylinders 354 mounted to the movable blocks 351, and adapted to move the front and rear holders 352 and 353, and a linear driver for horizontally moving the movable blocks 351 along the guide rails 355.

Figure 10:
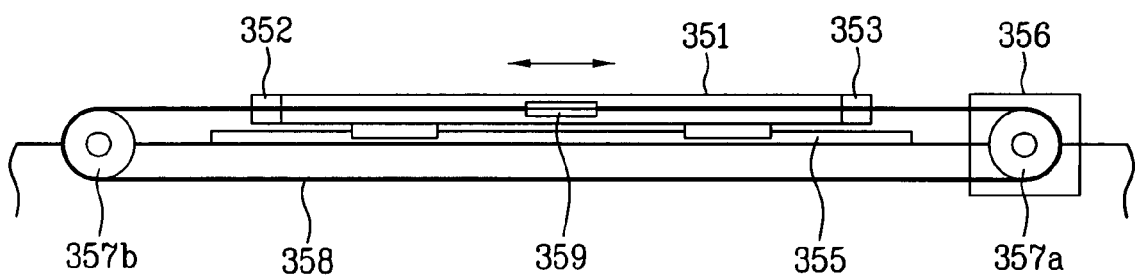

As shown in FIG. 10, the linear driver includes a pair of drive pulleys 357a rotatably mounted near one side of the movable blocks 351, a pair of driven pulleys 357b rotatably mounted near the other side of the movable blocks 351, and belts 358 each wound around an associated one of the drive pulleys 357a and an associated one of the driven pulleys 357b. The linear driver also includes a servo motor 356 for rotating the drive pulleys 358 in a desired direction by a desired amount. In FIG. 10, reference numeral "359" designates connecting members each adapted to connect an associated one of the belts 358 and an associated one of the movable blocks 351. Of course, the linear driver may comprise well-known linear driving systems such as a system including ball screws and servo motors, or a linear motor.

The horizontal moving unit 35 having the above-described configuration operates as follows.

When a test tray T is upwardly moved to the working place WP by the vertical moving units 36 (FIG. 8), the holders 352 and 353 are moved toward each other in accordance with operation of the pneumatic cylinders 354, to hold the upper and lower edges of the test tray T.

Subsequently, the servo motor 356 of the linear driver operates, thereby moving the belt 358. Accordingly, the movable blocks 351 are moved along the guide rails 355 to move the test tray T by a desired distance.

Figure 11:
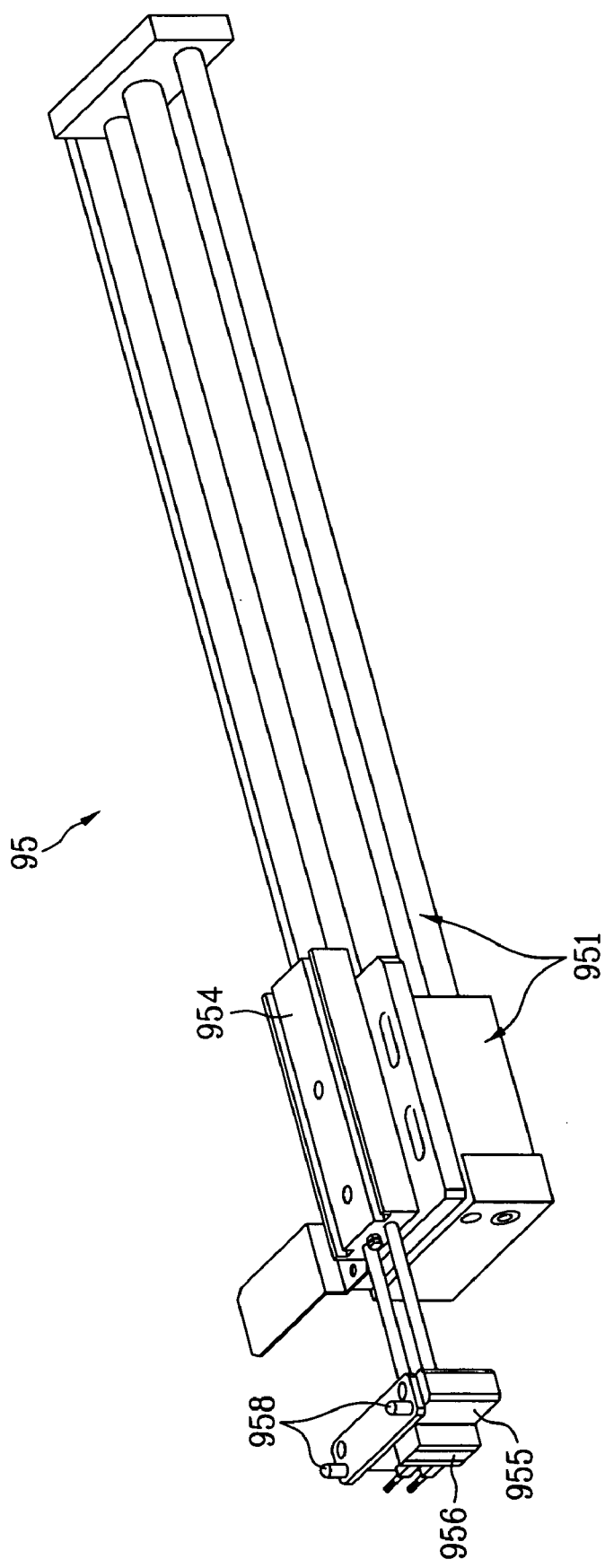
FIG. 11 is a perspective view illustrating a configuration of a tray shifter included in the handler of FIG. 1.

FIG. 11 illustrates an embodiment of each tray shifter 95 adapted to transfer a test tray T between the standby place SP of the exchanging station 30 (FIG. 3) and the first tray buffer 91 (FIG. 3) or between the standby place SP and the second tray buffer 92 (FIG. 3).

The tray shifter 95 includes a rodless cylinder 951 arranged to be extendable from the tray buffers to the standby place SP of the exchanging station 30, a block-moving pneumatic cylinder 954 fixed to the rodless cylinder 951, a holder block 955 mounted to the block-moving pneumatic cylinder 954 such that the holder block 955 is moved in the X-axis direction in accordance with operation of the block-moving pneumatic cylinder 954, a holder-moving pneumatic cylinder 956 mounted to the holder block 955, and holder pins 958 mounted to the holder block 955 such that the holder pins 958 are vertically movable to be selectively inserted into the insert holes (not shown) of the test tray T in accordance with operation of the holder-moving pneumatic cylinder 956.

When the tray shifter 95 having the above-described configuration operates to move the test tray T positioned at the standby place SP (FIG. 3) of the exchanging station 30 to an associated one of the first and second tray buffers 91 and 92, the block-moving pneumatic cylinder 954 extends outwardly to move the holder block 955 to a position beneath the test tray T. Thereafter, the holder-moving pneumatic cylinder 956 operates to upwardly move the holder pins 958 such that the holder pins 958 are inserted into the insert holes of the test tray T, thereby holding the test tray T. In this state, the rodless cylinder 951 operates to move the test tray T.

Now, an example of the operation of the handler having the above-described configuration according to the present invention will be described.

When the operator stacks user trays, which receive semiconductor devices to be tested, in the loading station 10, and then operates the handler, the first loading/unloading picker 51 vacuum-attracts the semiconductor devices in one user tray in the loading station 10, and transfers the semiconductor devices to the loading buffers 40. While transfer the semiconductor devices, the first loading/unloading picker 51 varies the pitch of the semiconductor devices from the semiconductor device pitch in the user tray to the semiconductor device pitch in each buffer 40.

Meanwhile, at the working place WP of the exchanging station 30, one test tray T, which is received in the exchanging station 30, is forwardly moved in accordance with operation of the horizontal moving unit 35 such that the rear two rows or even rows (second and fourth rows) of the test tray T, which includes four rows of carries C, are aligned with respective movement paths of the loading short pickers 61.

Thereafter, the loading short pickers 61 vacuum-attract semiconductor devices from the loading buffers 40, and load the semiconductor devices in respective corresponding carriers (not shown) of the test tray T, while moving independently along the second and third X-axis frames 63 and 64, respectively.

After semiconductor devices to be tested are filled in the carriers in the rear two rows or two even rows (second and fourth rows) of the test tray T, the horizontal moving unit 35 moves rearwards such that the carriers C in the front two rows or odd rows (first and third rows) of the test tray T are aligned with respective loading short pickers 61. In this state, the loading short pickers 61 vacuum-attract semiconductor devices from the loading buffers 40, and load the semiconductor devices in respective corresponding carriers of the test tray T, in the above-described manner.

After semiconductor devices are loaded in all carriers C of the test tray T in the exchanging station 30, the holder 365 (FIG. 8) of each vertical moving unit 36 moves vertically to hold the test tray T. Simultaneously, the holders 353 (FIG. 9) of the horizontal moving unit 35 move away from each other, thereby allowing the test tray T to be outwardly movable from the horizontal moving unit 35.

Subsequently, the pneumatic cylinder 361 (FIG. 8) of each vertical moving unit 36 operates to downwardly move the associated holder 365 and test tray T to the standby place SP. The upper and lower guide rails 83 and 84 (FIG. 5) of the rotator 80 are moved toward each other in accordance with operation of the first pneumatic cylinder 86, to support the upper and lower edges (rear and front edges) of the test tray T, respectively. Simultaneously, the holders 88 of the rotator 80 operate to cause the holder bars 886 and rollers 888 (FIG. 7) of the holders 88 to hold respective lateral edges of the test tray T.

After the test tray T is held by the rotator 80 at the standby place SP of the exchanging station 30, as described above, the rotator 80 rotates 90° to position the test tray T at the entrance of the test station 70, as shown in FIG. 2.

In this state, the holders 88 operate reversely to release the test tray T held by the holder bars 886 and rollers 888 (FIG.

7). Simultaneously, the front transfer unit 76 of the test station 70 operates to slide the test tray T into the preheating chamber 71.

Figure 4:
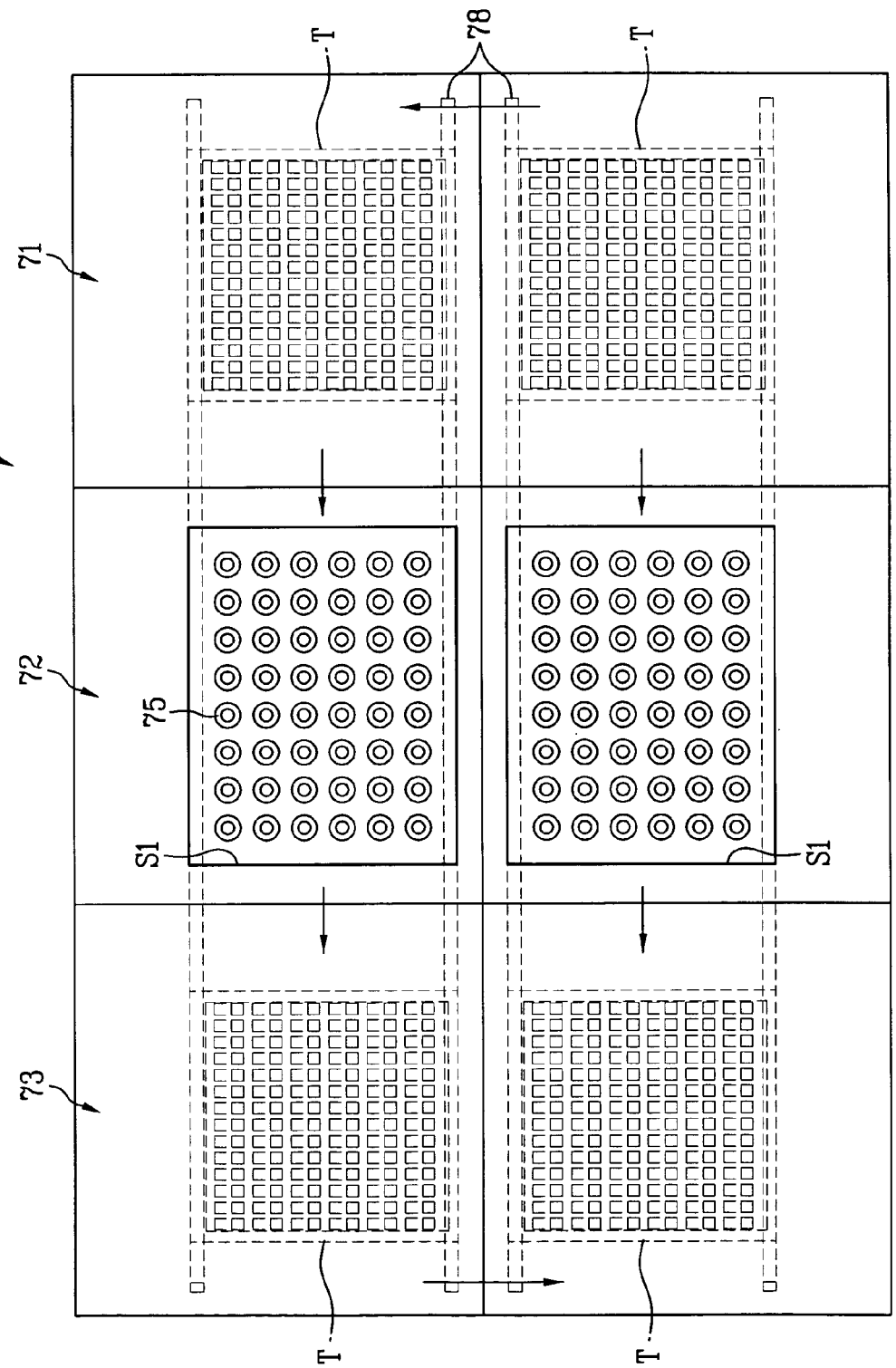
FIG. 4 is a schematic rear view of the handler shown in FIG. 1.

As the above-described procedure is repeated, test trays T are sequentially introduced into the preheating chamber 71. Each test tray T introduced into the preheating chamber 71 is heated or cooled to a predetermined heating or cooling temperature while being rearwardly moved stepwise. After reaching the rearmost or downstream end position in the preheating chamber 71, the test tray T is upwardly moved by the elevator (not shown) if the ID No. of the test tray T is an odd number (or even number), and is then fed to the upper test chamber 72 by the associated rear transfer unit 77, as shown in FIG. 4. On the other hand, if the ID No. of the test tray T reaching the rearmost or downstream end position in the preheating chamber 71 is an even number (or odd number), the test tray T is directly fed to the lower test chamber 72 by the associated transfer unit 77.

When one test tray T, which is introduced into the associated test chamber 72, is aligned with the test board 74 of the test chamber 72 in front of the test board 74, the associated contact unit 75 presses the carriers (not shown) of the test tray T against the test board 74 to connect the semiconductor devices of the test tray T to the test sockets (not shown) of the test board 74. In this state, an electrical performance test is carried out.

After completion of the test, the test tray T is fed to the associated defrosting chamber 73 by the associated rear transfer unit 77. In the defrosting chamber 73, the test tray T is moved stepwise by an additional transfer unit (not shown). During this movement, the semiconductor devices of the test tray T are returned to a room temperature state.

Of course, if no high-temperature or low-temperature test is carried out, it is unnecessary to heat or cool semiconductor devices in the pre-heating chambers 71. In this case, it is also unnecessary to reversely cool or heat the semiconductor devices in the defrosting chambers 73, and thus, to return the semiconductor devices to a room temperature state.

After reaching the downstream end position of the associated defrosting chamber 73, the test tray T is fed to an intermediate region of the test station 70 by the front transfer unit 76. Subsequently, the test tray T is interposed between the upper and lower guide rails 83 and 84 (FIG. 5) of the rotator 80, and is then held by the holders 88.

Thereafter, the rotator 80 pivots 90°, thereby positioning the test tray T in a horizontal state at the standby place SP of the exchanging station 30.

In this state, the upper and lower guide rails 83 and 84 are moved away from each other in accordance with operation of the first pneumatic cylinders 86 (FIG. 5), thereby freely releasing the test tray T. Simultaneously, the second pneumatic cylinders 87 operate to support the test tray T in a state in which the test tray T is slightly raised from the rotator 80.

Next, the holder 365 (FIG. 8) of each vertical moving unit 36 is turned through a predetermined angle by the associated rotary cylinder 364. In this state, the test tray T is upwardly moved to the working place WP by the pneumatic cylinder 361 of each vertical moving unit 36.

When the test tray T is raised to the working place WP, the holders 353 (FIG. 9) of the horizontal moving unit 35 moves toward each other, thereby holding the upper and lower ends (rear and front ends) of the test tray T. In this state, the holder 365 of each vertical moving unit 36 moves downwards to return to its original position.

Thereafter, the test tray T is moved by a predetermined pitch in accordance with operation of the horizontal moving unit 35 such that the carriers C in the rear two rows or even rows of the test tray T are aligned with respective movement paths of the unloading short pickers 62.

In this state, the unloading short pickers 62 vacuum-attract the tested semiconductor devices from the test tray T, and transfer the semiconductor devices to the unloading buffers 45, while moving along the second and third X-axis frames 63 and 64, respectively. At this time, at the side opposite to the unloading short pickers 62, the loading short pickers 61 vacuum-attract semiconductor devices, to be tested, from the loading buffers 40, and load the semiconductor devices in the empty carriers C of the test tray T arranged in the exchanging station 30.

After the tested semiconductor devices are laid on the unloading buffers 45 by the unloading short pickers 62, the second loading/unloading picker 52 sorts the semiconductor devices in accordance with the results of the test, and puts the sorted semiconductor devices into associated user trays, respectively.

Meanwhile, when the test tray T arranged in the exchanging station 30 is completely filled with semiconductor devices to be tested, the above-described procedure, namely, the procedure of transfer the test tray T to the test station 70, testing the semiconductor devices of the test tray T, and unloading the tested semiconductor devices in the exchanging station 30 is carried out. Thus, testing of semiconductor devices is continuously carried out as the above-described procedure is repeatedly executed.

On the other hand, if transfer of test trays T is carried out between the exchanging station 30 and the test station 70 in such a manner that one test tray T is fed from the exchanging station 30 to one preheating chamber 71 of the test station 70, and another test tray T is subsequently fed from one defrosting chamber 73 of the test station 70 to the working place WP of the exchanging station 30, no process is carried out at the working place WP during the transfer of the test trays T. In this case, accordingly, a degradation in workability may occur.

To this end, in accordance with the present invention, test trays T are temporarily held in the first and second tray buffers 91 and 92 arranged at opposite sides of the standby place SP of the exchanging station 30, respectively, while transfer of another test tray T is carried out between the exchanging station 30 and the test station 70, in order to achieve enhancement in workability.

This will be described in detail with reference to FIGS. 12 to 19. For the best understanding, the following description will be given only in conjunction with the positions of test trays T under the condition in which the rotator 80, vertical moving units 36, tray shifters 95, and horizontal moving unit 35 (FIGS. 1 to 3) are omitted from FIGS. 12 to 19. Also, the following description will be given only in conjunction with one chamber layer of the test station 70. In the drawings, "WL" represents a level corresponding to the working place WP of the exchanging station 30, and "SL" represents a level corresponding to the standby place SP of the exchanging station 30 or the buffers 91 and 92.

Also, "WT1" and "WT2" represent test trays to be fed from the test station 70 to the exchanging station 30, for loading or unloading of semiconductor devices, and "DT" represents a test tray fed from the exchanging station 30 to the test station 70 after completion of loading or unloading of semiconductor devices.

Figure 12:
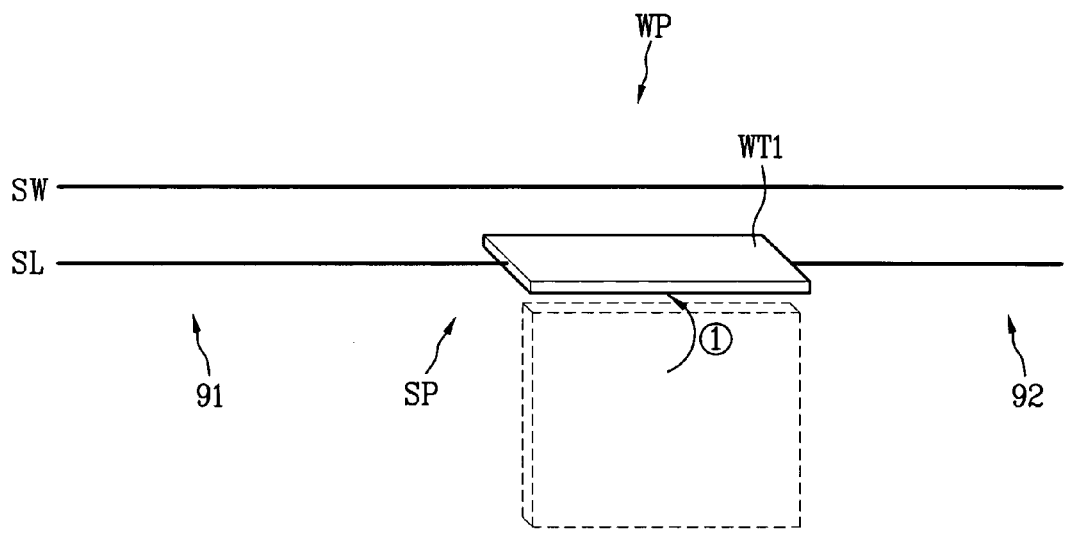
FIGS. 12 to 19 are schematic views sequentially explaining an example of a test tray transfer procedure carried out between an exchanging station and a test station included in the handler of FIG. 1.
Figure 13:
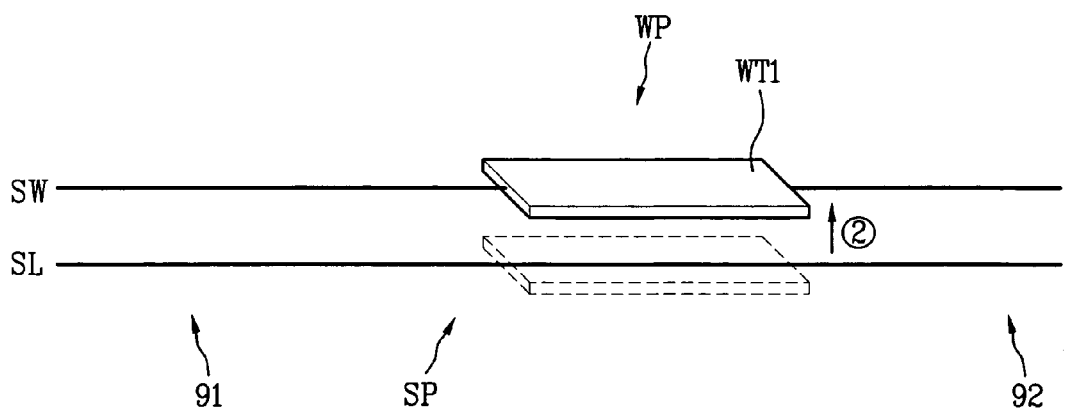

First, as shown in FIG. 12, an empty test tray WT1, which is positioned in the test station 70 while being maintained in an upright or vertical state, is fed from the test station 70 to the standby place SP of the exchanging station 30 while being turned in a horizontal state in accordance with rotation of the rotator 80 (FIG. 2). Thereafter, the test tray WT1 is raised to the working place WP in accordance with operation of the vertical moving units 36 (FIG. 2), as shown in FIG. 13.

Figure 14:
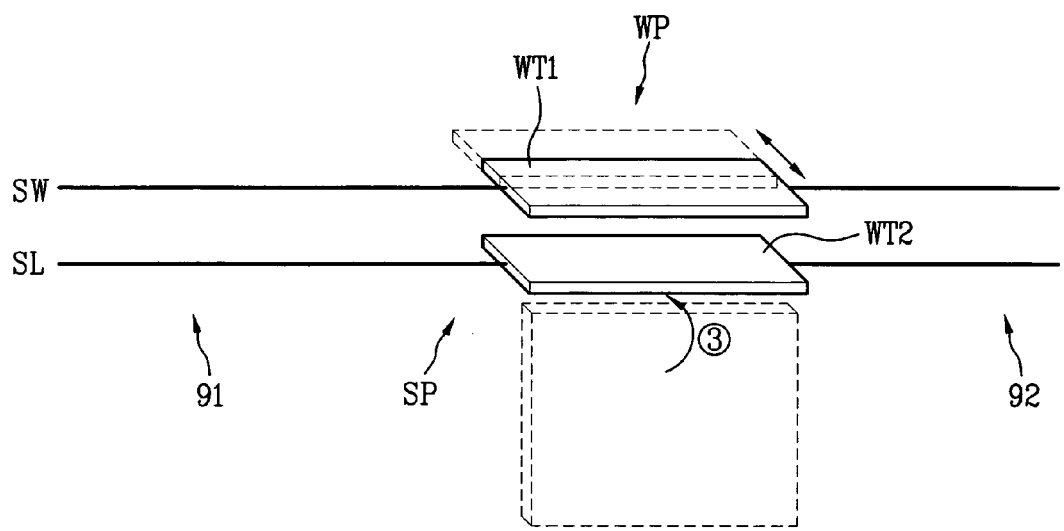

Next, as shown in FIG. 14, another test tray WT2 is fed from the test unit 70 to the standby position SP of the exchanging station 30 from the test station 70 in accordance with operation of the rotator 80. At this time, a process for loading semiconductor devices in the carriers C of the test tray WT1 is carried out at the working place WP while the test tray WT1 is forwardly or rearwardly moved by a predetermined pitch in accordance with operation of the horizontal moving unit 35 (FIG. 2).

Figure 15:
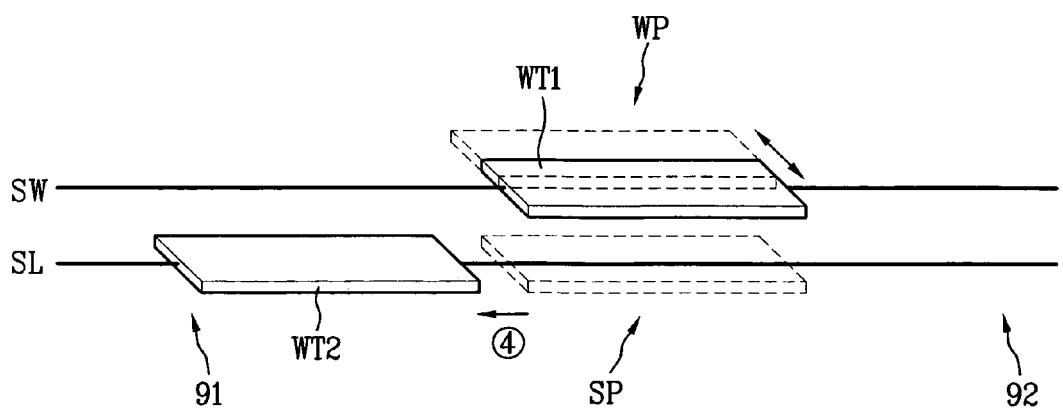

During the process of loading semiconductor devices in the test tray WT1 at the working place WP, the test tray WT2 is horizontally moved from the standby place SP to the first tray buffer 91 by the associated tray shifter 95 (FIG. 3), to await a subsequent process, as shown in FIG. 15.

Figure 16:
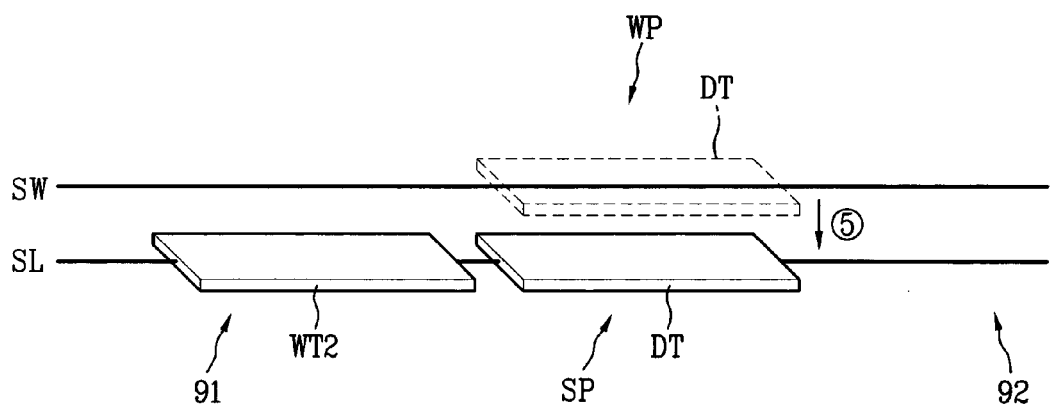

When the process of loading semiconductor devices in the test tray WT1 at the working place WP is completed, this test tray, namely, the test tray DT, is lowered to the standby place SP in accordance with operation of the vertical moving units 36 (FIG. 2), as shown in FIG. 16.

Figure 17:
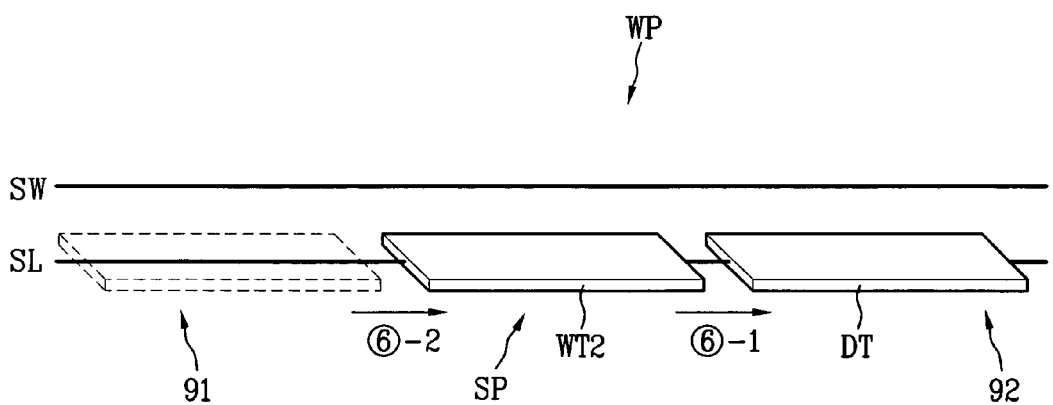
Figure 18:
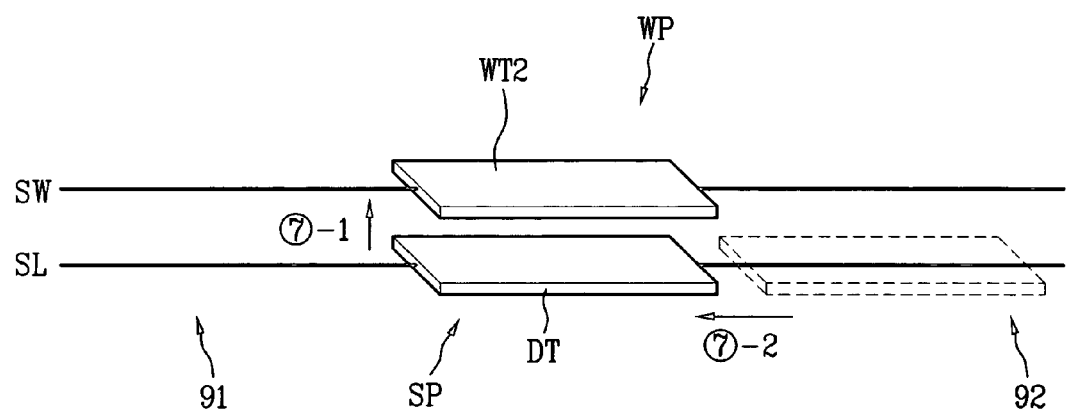
Figure 19:
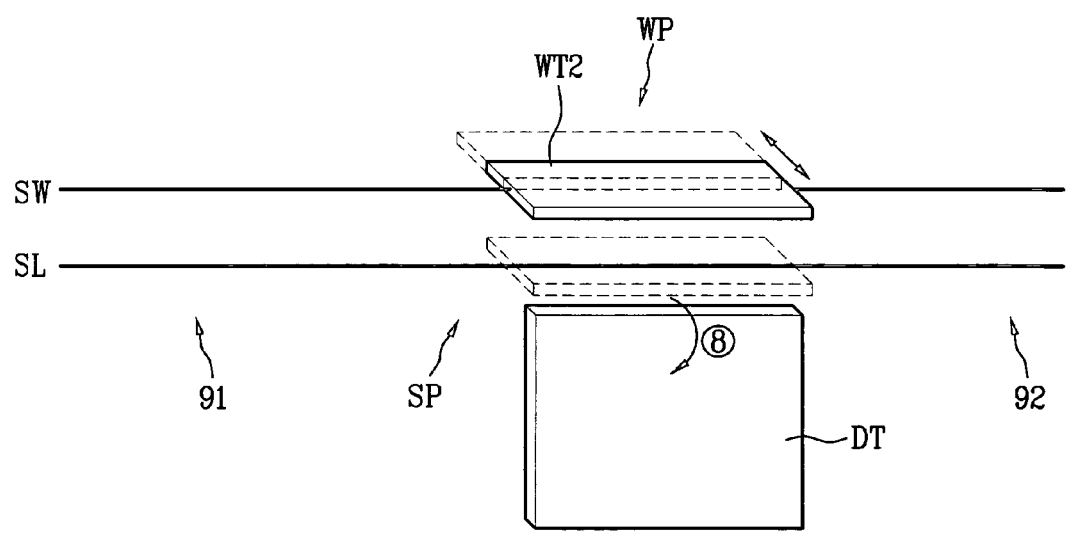

As shown in FIG. 17, the test tray DT is then fed to one of the second buffers 45. Simultaneously, the test tray WT2 arranged in the first tray buffer 91 is moved to the standby place SP. Thereafter, as shown in FIG. 18, the test tray WT2 is raised from the standby place SP to the working place WP. In this state, the process of unloading the tested semiconductor devices in the test tray WT2, and loading new semiconductor devices, to be tested, in the test tray WT2 are carried out. Simultaneously, the test tray DT, which has been moved to the second tray buffer 92, and awaits a subsequent process, is moved to the standby place SP, as shown in FIG. 18.

During the process of unloading/loading semiconductor devices from/in the test tray WT2 at the working place WP, the test tray DT fed to the standby place SP is fed to the test station 70 (FIG. 2) by the rotator 80 (FIG. 2). Immediately, the test tray DT is fed to the preheating chamber 71 (FIG. 1) of the test station 70. Simultaneously, a test tray T is fed from the defrosting chamber 73 (FIG. 1) of the test station 70 to the standby place SP of the exchanging station 30 by the rotator 80. Thus, transfer of test trays T between the exchanging station 30 and the test station 70 is carried out as the procedures shown in FIGS. 14 to 19 are repeatedly executed.

The procedures of transfer test trays T carried out in the exchanging station 30, test station 70, and first and second buffers 91 and 92 may be appropriately variable in accordance with operator's selection.

Figure 20:
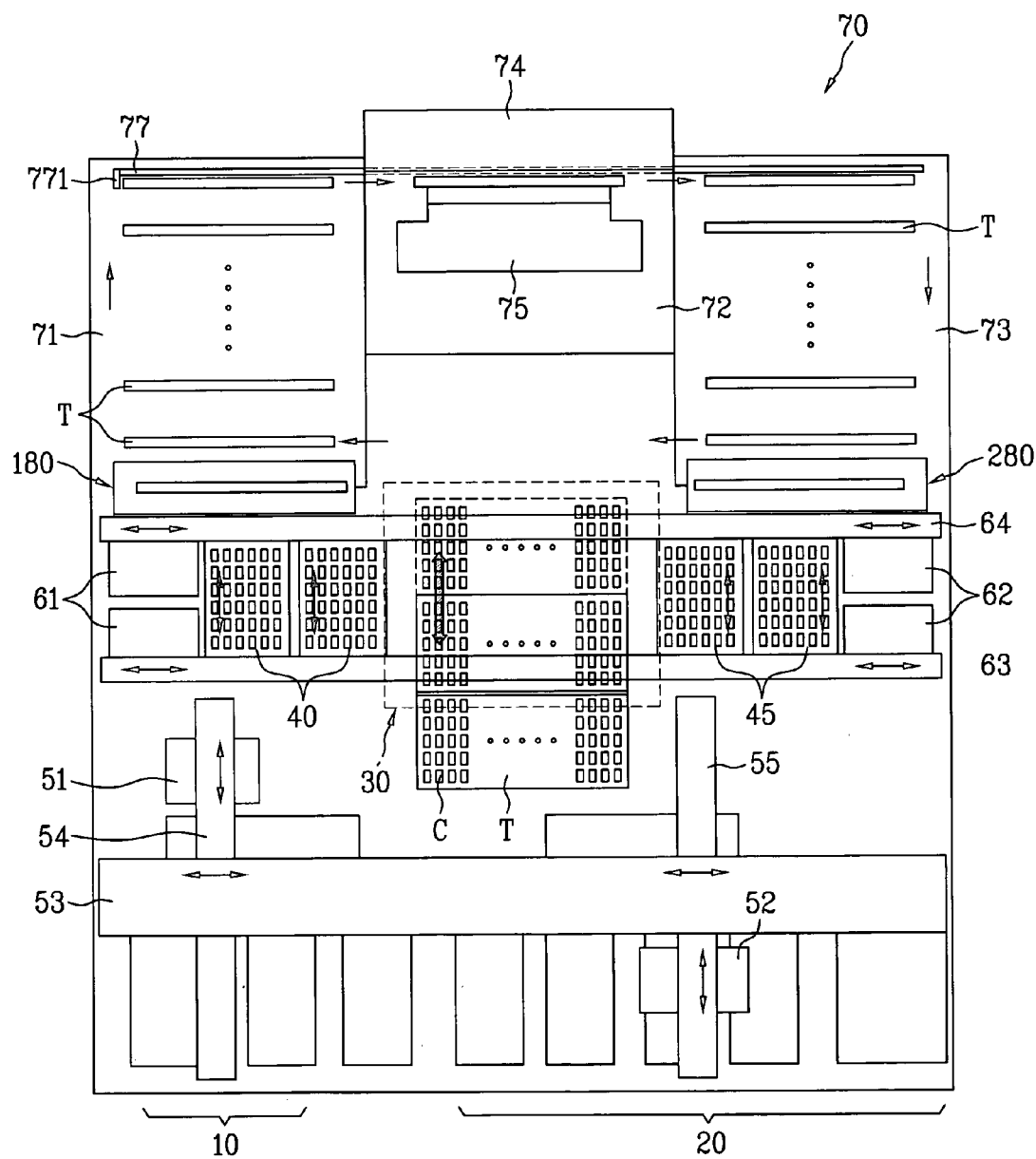
FIG. 20 is a plan view schematically illustrating a handler for testing semiconductor devices in accordance with another embodiment of the present invention.
Figure 21:
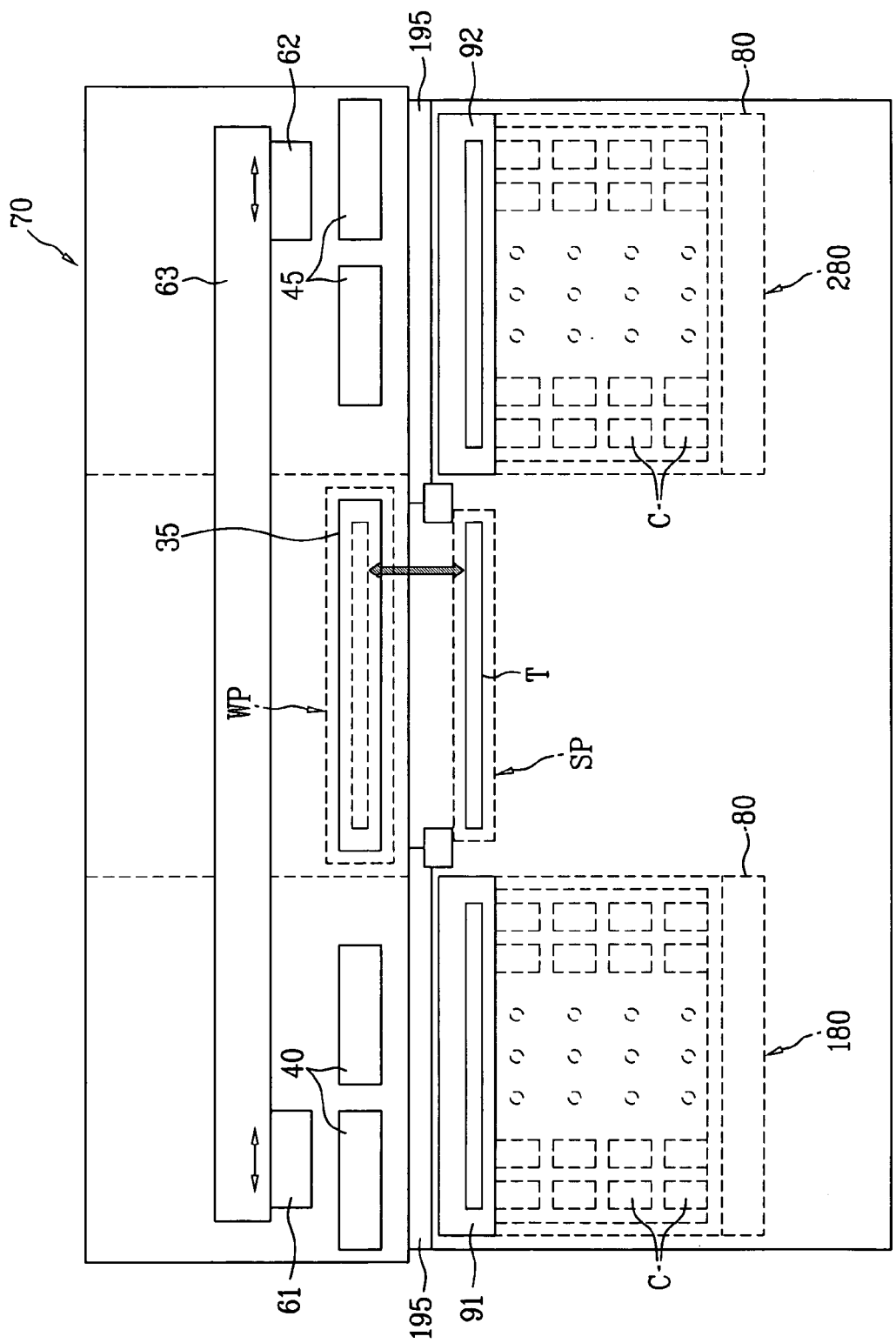
FIG. 21 is a schematic front view of the handler shown in FIG. 20.

Meanwhile, FIGS. 20 and 21 are views illustrating a configuration of a handler according to another embodiment of the present invention. The basic configuration of the handler according to this embodiment is similar to that of FIG. 1.

Provided, in the handler according to this embodiment, no rotator is arranged between the standby place SP of the exchanging station 30 and the test station 70. In place, a first rotator 180 and a second rotator 280 are arranged between the first tray buffer 91 and the preheating chambers 71 and between the second tray buffer 92 and the defrosting chambers 73, respectively. In this embodiment, it is also preferred that the tray shifters 195 each adapted to transfer test trays T between the standby place SP and an associated one of the first and second tray buffers 91 and 92 be arranged above the first and second rotators 180 and 280 so that the tray shifters 195 do not interfere with rotation of the first and second rotators 180 and 280, respectively.

In this embodiment, accordingly, when a new test tray T, in which semiconductor devices to be tested are loaded, is fed from the standby place SP to the first tray buffer 91, the first rotator 180 pivots to transfer the test tray T to the associated preheating chamber 71.

Meanwhile, when a test tray T, in which tested semiconductor devices are loaded, is discharged from the associated defrosting chamber 73, the second rotator 280 pivots to transfer the test-completed test tray T to the second tray buffer 92. The test tray T is then fed to the standby place Sp of the exchanging station 30.

Where two rotators 180 and 280 are used, as described above, the overall configuration of the handler becomes more or less complex. In this case, however, loading of test trays into the preheating chambers 71 and unloading of test trays from the defrosting chambers 73 can be directly achieved without a requirement to repeatedly execute the procedure of moving the test tray T outside the rotator. Accordingly, there is an advantage in that the overall operation is simple.

Figure 22:
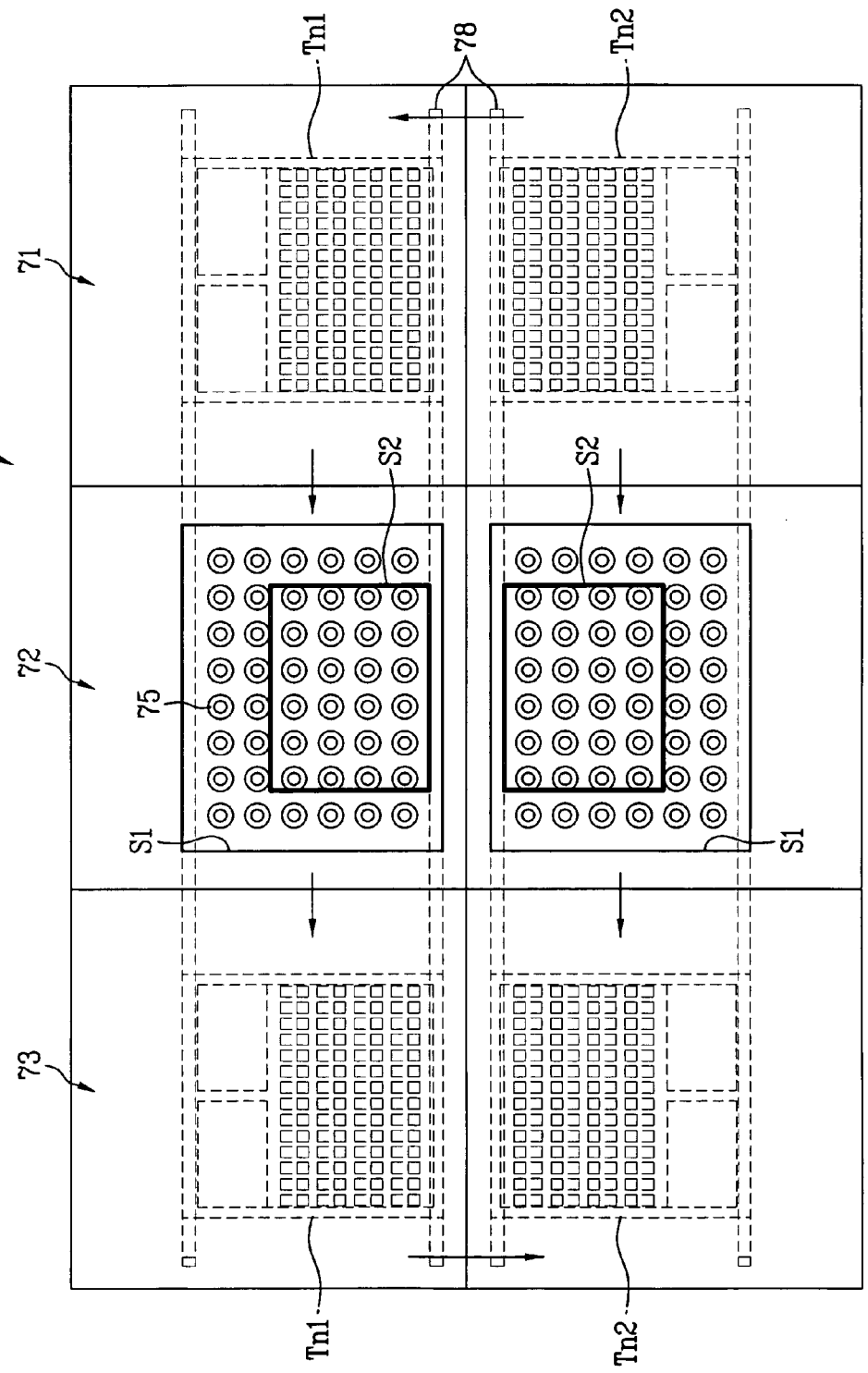
FIG. 22 is a plan view schematically illustrating a handler for testing semiconductor devices in accordance with another embodiment of the present invention.
Figure 23:
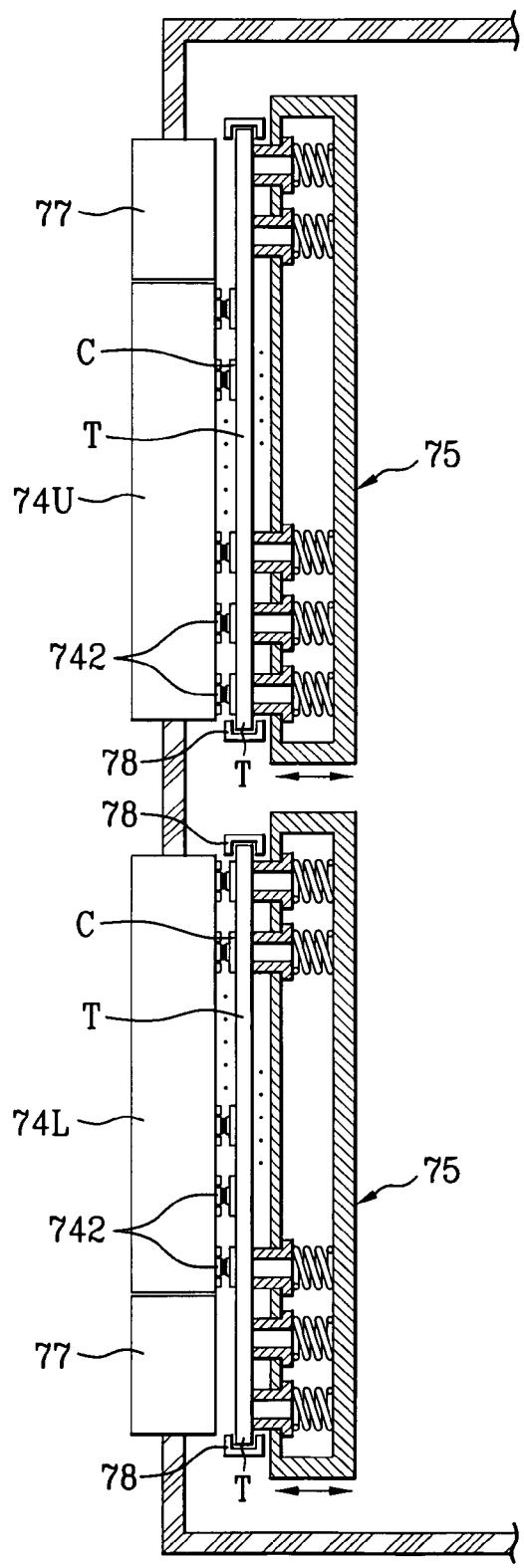
FIG. 23 is a longitudinal sectional view schematically illustrating the state in which semiconductor devices are connected to test sockets of a test board in a test chamber of the handler shown in FIG. 22.

FIGS. 22 and 23 illustrate a handler according to another embodiment of the present invention. This embodiment illustrates the case in which test boards 74 having a size smaller than the design area of the test chambers 72 in the test station 70 are mountable in the test chambers 72, to achieve an enhancement in compatibility. The basic configuration of the handler according to this embodiment is similar to that of the first embodiment.

In the handlers according to the afore-described embodiments, the rear region of each test chamber 72 where one test board 74 is mounted (hereinafter, referred to as a "test board region S1") is designed, taking into consideration the assumption that the test board 74, which is the same size as the test board region S1 and has a maximal number of simultaneously connectable test sockets 742 with a maximal pitch, is mounted to the test chamber 72.

For example, the test board region S1 may be designed under the condition in which it is assumed that the test board 74U or 74L having a maximum of 128 test sockets 742 (hereinafter, referred to as a "128-para test board") is mounted. In the afore-described handlers, of course, the total number of test sockets 742 is 256 because the test boards 74U and 74L are mounted in two layers in the test chambers 72, respectively.

Also, the sizes of the contact units 75, guide rails 78 guiding movement of test trays T, drivers, and test trays T are designed to correspond to the size of the test board regions S1.

Accordingly, where the test board 74 having a maximal number of test sockets 742 is mounted to the test board region S1, it is possible to perform a desired test by mounting the test board 74 in the test board region S1 without any structural modification, and mounting carriers to the entire region of the test tray.

However, where the test board 74 having a reduced number of test sockets 742 is mounted to the test board region S1, for example, where a test board having 64 test sockets 742 (referred to as a "64-para test board") or is used, as in conventional testers, or where a test board having the same number of test sockets 742 as the above-described test board, but having a reduced test socket pitch, is used, the region occupied by the test sockets 742 of the test board 74 is reduced, as shown by "S2" in FIG. 22. This reduced region will be referred to as a "reduced test region S2".

Accordingly, where the 64-para test board is used, as described above, the operator fills an insulator 77 in a space defined between the test board region S1 and the reduced test region S2, to prevent air present in the test chamber 72 from being outwardly leaked.

Figure 24:
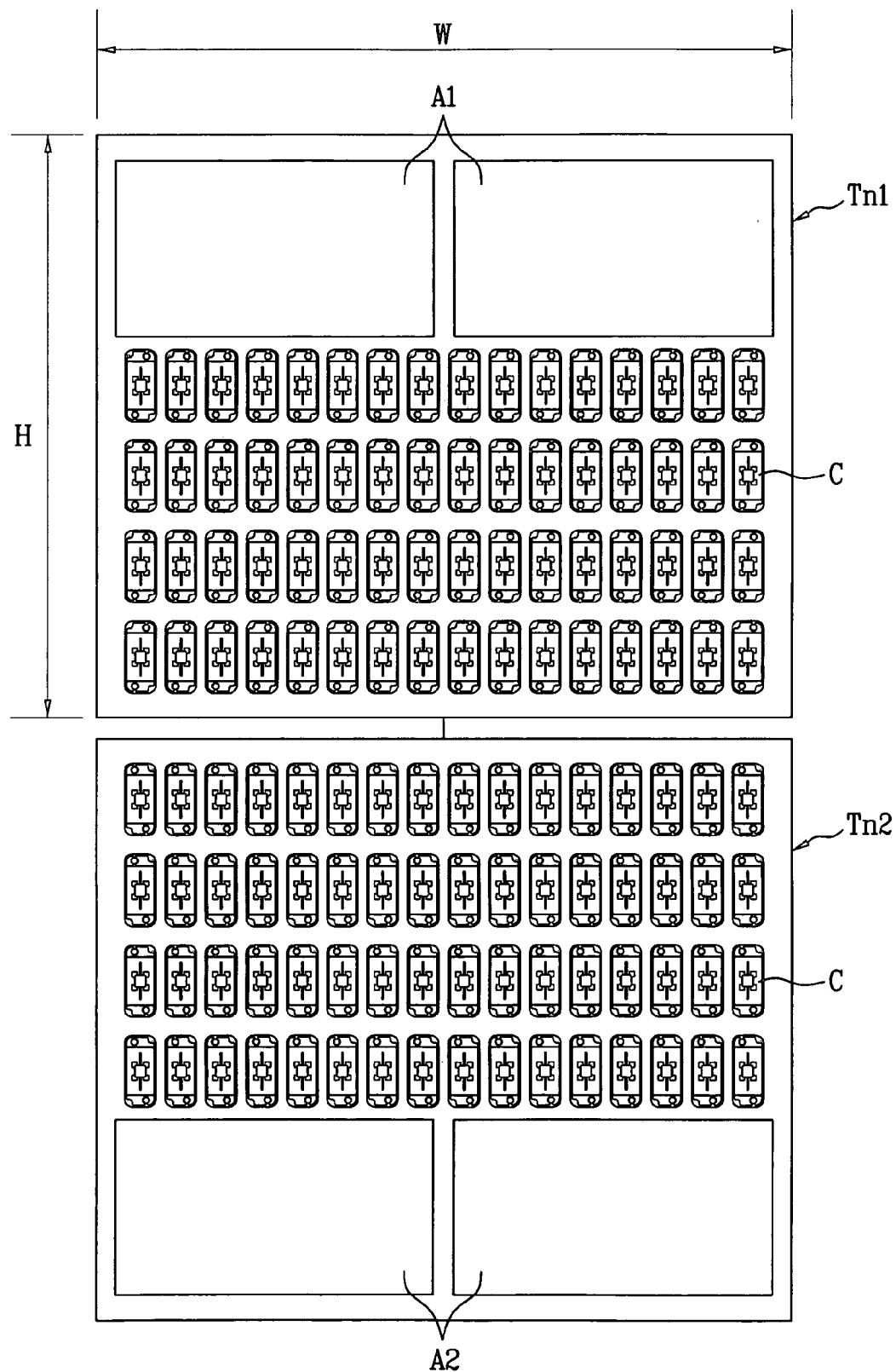
FIG. 24 is a schematic front view of the handler shown in FIG. 20.

In addition, as shown in FIG. 24, a desired test is carried out, using two kinds of test trays $Tn_1$ and $Tn_2$ each mounted with carriers C only at a region thereof corresponding to the reduced test region S2.

Each of the test trays $Tn_1$ and $Tn_2$ has a lateral width W less than that of the test tray applied to the 128-para test board, but has a vertical length H identical to that of the test tray applied to the 128-para test board. Accordingly, it is possible to move the test trays $Tn_1$ and $Tn_2$ along the guide rails 78 (FIG. 22) adapted to guide the movement of the test trays T in the test station 70, without shifting the positions of the guide rails 78.

Since the test trays $Tn_1$ and $Tn_2$ are provided with carriers C only at regions thereof corresponding to the reduced test region S2, respectively, carrier absent regions A1 and A2 where no carriers are mounted are formed at the remaining regions of the test tray $Tn_1$ and $Tn_2$, respectively.

In this embodiment, in the test tray $Tn_1$ to be fed to the upper test board 74U (FIG. 4), the carrier absent regions A1 are formed at the upper portion of the test tray $Tn_1$. On the other hand, in the test tray $Tn_2$ to be fed to the lower test board 74L (FIG. 4), the carrier absent regions A2 are formed at the upper portion of the test tray $Tn_2$.

That is, the carrier absent regions A1 and A2 of the test trays $Tn_1$ and $Tn_2$, which are fed to the upper and lower test boards 74U and 74L, respectively, are arranged opposite to each other.

When a test is carried out in the handler designed to use the 128-para test boards, using the 64-para test boards, the test trays $Tn_1$ to be supplied to the upper test board 74U and the test trays $Tn_2$ to be supplied to the lower test board 74L must be supplied after being sorted in the preheating chambers 71 because the test trays $Tn_1$ and $Tn_2$ have different structures.

To this end, as shown in FIG. 22, the controller of the handler detects the kind of the test tray reaching the downstream end of each preheating chamber 71, and performs a control operation to supply the test tray to the upper or lower test board 74U or 74L in accordance with the detected test tray kind.

Also, since the test tray $Tn_1$ to be supplied to the upper test board 74U and the test tray $Tn_2$ to be supplied to the lower test board 74L have different structures, as described above, the controller must control the movement pitch of the test tray in accordance with the kind of the test tray when semiconductor devices are loaded/unloaded in/from the test tray in the exchanging station 30 (FIG. 1) by the horizontal moving unit 35 moving the test tray, in order to accurately align the test tray beneath the short pickers 61 or 62.

Although test trays having different structures are supplied to the upper and lower test boards 74U and 74L, respectively, in this embodiment, test trays having the same structure may be supplied, so long as the reduced test regions S2 of the test trays respectively supplied to the upper and lower test boards 74U and 74L are formed at the same position in the test board regions S1 of the test trays.

Also, although test boards have been described as being mounted in two layers in the test chambers 72, respectively, in this embodiment, it is possible to achieve a desired enhancement in the compatibility of the handler even in the case in which a single test board is used, so long as the test trays are configured to have a test region corresponding to the test board.

In accordance with this embodiment, diverse test trays may be used in accordance with the structure and size of the test board without considerable structural modification, as described above. Accordingly, it is possible to perform a desired test in a single handler, using diverse test boards having different numbers of test sockets. Thus, there are advantages in that it is possible to achieve an enhancement in the compatibility of the handler, and to reduce the costs of the handler.

In particular, even when the carrier pitch is varied due to a change in the test socket pitch of the test board, thereby causing a variation in test region, it is possible to perform a desired test by correspondingly modifying only the test trays without a structural modification of the handler.

As apparent from the above description, in accordance with the present invention, semiconductor devices externally fed to the exchanging station are loaded/unloaded in/from test trays directly in the exchanging station. Accordingly, it is possible to simplify the processes carried out in the exchanging station, and to reduce the working time in the exchanging station, and thus, to greatly increase the number of semiconductor devices simultaneous testable.

Also, since tray buffers are provided at opposite sides of the exchanging station to allow test trays to be in a temporal standby state, it is possible to more efficiently execute the procedure of transfer test trays between the test station and the exchanging station.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A handler for testing semiconductor devices comprising:
    a loading station in which semiconductor devices to be tested are stored;
    an unloading station in which tested semiconductor devices are stored after being sorted in accordance with test results of the tested semiconductor devices;
    test trays each provided with a plurality of carriers for temporarily holding the semiconductor devices;
    an exchanging station comprising a horizontal moving unit for horizontally moving the test tray by a predetermined pitch at a working place defined in the exchanging station, the exchanging station performing a process for loading the semiconductor devices in the carriers of the test tray and unloading the semiconductor devices from the carriers of the test tray while moving the test tray by the predetermined pitch;
    a test station in which at least one test board having a plurality of test sockets to be electrically connected with semiconductor devices is mounted, the test station performing a test while connecting the semiconductor devices in the test trays, which are fed from the exchanging station to the test station, to the test sockets;
    device transfer units for transfer the semiconductor devices between the loading station and the exchanging station to load the semiconductor devices in the carriers of the test trays, and transfer the semiconductor devices between the exchanging station and the unloading station to unload the semiconductor devices from the carriers of the test trays, respectively; and a tray transfer unit for transfer the test trays between the exchanging station and the test station.

2. The handler according to claim 1, further comprising:
a vertical moving unit for vertically moving the test tray between the working place of the exchanging station and a standby place which is defined in the exchanging station beneath the working place and at which a test tray transfer process is carried out by the tray transfer unit.

3. The handler according to claim 2, wherein the vertical moving unit comprises:
a pneumatic cylinder fixedly arranged at one side of the standby place of the exchanging station;
a movable block vertically movable by the pneumatic cylinder; and
a holder mounted to the movable block such that the holder is insertable into an insert hole formed at the test tray, and adapted to hold or release the test tray.

4. The handler according to claim 3, wherein the vertical moving unit further comprises:
a rotary cylinder rotatably mounted to the movable block, and adapted to turn the holder to a position beneath and outside the test tray.

5. The handler according to claim 2, further comprising:
at least one tray buffer arranged at least one side of the standby place of the exchanging station, and adapted to receive the test tray fed from the standby place to allow the test tray to be in a standby state; and
at least one tray shifter adapted to transfer the test tray between the standby place and the tray buffer.

6. The handler according to claim 5, wherein the at least one tray buffer comprises first and second tray buffers arranged at the same level at opposite sides of the standby place of the exchanging station, respectively, each of the first and second tray buffers receiving the test tray horizontally fed from the standby place to allow the test tray to be in a standby state.

7. The handler according to claim 5, wherein the tray shifter comprises:
at least one rodless cylinder extendable from the tray buffer to the standby place of the exchanging station;
a holder block mounted to the rodless cylinder such that the holder block is movable together with the rodless cylinder; and
a holder pin mounted to the holder block such that the holder pin is movable by a pneumatic cylinder mounted to the holder block, to selectively hold or release the test tray.

8. The handler according to claim 7, wherein the holder block is vertically movable with respect to the test tray by a pneumatic cylinder mounted to the rodless cylinder.

9. The handler according to claim 2, wherein the tray transfer unit comprises:
a rotator arranged between an upstream end of the test station and the standby place of the exchanging station such that the rotator is pivotable through an angle of 90° to transfer the test tray between the upstream end of the test station and the standby place of the exchanging station while changing the test tray between a horizontal state and a vertical state.

10. The handler according to claim 9, wherein the rotator comprises:
a rotating shaft rotatably arranged at the rear of the exchanging station;
a frame coupled, at an upper end thereof, to the rotating shaft such that the frame is pivotable in accordance with the rotation of the rotating shaft;
an upper guide rail mounted to an upper portion of the frame such that the upper guide rail is vertically movable, and adapted to support an upper edge of the test tray;
a lower guide rail mounted to a lower portion of the frame such that the lower guide rail is vertically movable, and adapted to support a lower edge of the test tray;
a pair of holders respectively mounted to the upper guide rail at opposite sides of the upper guide rail, and adapted to hold or release the test tray;
rotating means for rotating the rotating shaft; and
rail moving means for vertically moving the upper and lower guide rails.

11. The handler according to claim 6, wherein the tray transfer unit comprises:
tray shifters each adapted to horizontally transfer the test tray between the exchanging station and an associated one of the first and second tray buffers;
a first rotator arranged between the first tray buffer and a test tray inlet position of the test station such that the rotator is pivotable through an angle of 90° to transfer the test tray arranged in a horizontal state on the first tray buffer to the test station after changing the test tray from the horizontal state to a vertical state; and
a second rotator arranged between the second tray buffer and a test tray outlet position of the test station such that the rotator is pivotable through an angle of 90° to transfer the test tray arranged in the vertical state in the test station to the second tray buffer after changing the test tray from the vertical state to the horizontal state.

12. The handler according to claim 1, wherein the device transfer unit comprises:
at least one picker arranged over each of the loading station, the unloading station and the exchanging station such that the picker is horizontally and vertically movable to transfer semiconductor devices in a state of vacuum-attracting the semiconductor devices.

13. The handler according to claim 12, wherein the at least one picker comprises:
a loading picker arranged to move between the loading station and the exchanging station, and adapted to transfer the semiconductor devices from the loading station to the exchanging station and to load the fed semiconductor devices in the test tray; and
an unloading picker arranged to move between the exchanging station and the unloading station, and adapted to unload the semiconductor devices from the test tray and to transfer the unloaded semiconductor devices to the unloading station.

14. The handler according to claim 1, further comprising:
at least one loading buffer arranged between the loading station and the exchanging station, and adapted to receive the semiconductor devices to be tested, to allow the received semiconductor devices to be in a temporal standby state; and
at least one unloading buffer arranged between the exchanging station and the unloading station, and adapted to receive the tested semiconductor devices, to allow the received semiconductor devices to be in a temporal standby state.

15. The handler according to claim 14, wherein the device transfer unit comprises:
at least one first picker which is movable between the loading station and the loading buffer and between the unloading buffer and the unloading station, to transfer the semiconductor devices to be tested and the tested semiconductor devices; and at least one second picker which is movable between the loading buffer and the exchanging station and between the exchanging station and the unloading buffer, to transfer the semiconductor devices to be tested and the tested semiconductor devices.

16. The handler according to claim 15, wherein the at least one first picker comprises:

a first loading picker which is movable between the loading station and the loading buffer, to transfer the semiconductor devices to be tested; and a first unloading picker which is movable between the unloading buffer and the unloading station, to transfer the tested semiconductor devices.

17. The handler according to claim 15, wherein the first picker has a semiconductor device pitch variable between a semiconductor device pitch in the loading station and a semiconductor device pitch in the buffers.

18. The handler according to claim 14, wherein the buffers are arranged at opposite sides of the exchanging station, respectively.

19. The handler according to claim 18, wherein the device transfer unit comprises:

a first picker and a second picker which are independently movable between the loading station and the loading buffer and between the unloading buffer and the unloading station, to transfer the semiconductor devices to be tested and the tested semiconductor devices, respectively; and a third picker and a fourth picker which are independently movable between one of the buffers and the exchanging station and between the other one of the buffers and the exchanging station, to transfer the semiconductor devices to be tested and the tested semiconductor devices, respectively.

20. The handler according to claim 19, wherein the device transfer unit further comprises:

a fifth picker and a sixth picker respectively arranged parallel to the third and fourth pickers, and adapted to transfer the semiconductor devices to be tested and the tested semiconductor devices between the one buffer and the exchanging station and between the other buffer and the exchanging station.

21. The handler according to claim 14, further comprising:

a buffer moving unit for moving the buffers by a predetermined pitch.

22. The handler according to claim 1, wherein the test station comprises:

a preheating chamber for preheating or precooling the test trays fed to the test station, the preheating chamber including a heating or cooling atmosphere forming unit adapted to heat or cool the interior of the preheating chamber to a predetermined temperature;

a test chamber for testing the test trays fed to the test station at a predetermined temperature, the test chamber including a heating or cooling atmosphere forming unit adapted to heat or cool the interior of the test chamber to the predetermined temperature, and at least one test board detachably mounted at a rear portion of the test chamber; and a defrosting chamber for returning the semiconductor devices tested in the test chamber to a room temperature state, the defrosting chamber including a heating or cooling atmosphere forming unit adapted to heat or cool the interior of the defrosting chamber to a predetermined temperature.

23. The handler according to claim 22, wherein the at least one test board comprises two test boards arranged in two layers at the rear portion of the test chamber, respectively, to enable the semiconductor devices of two test trays to be tested.

24. The handler according to claim 23, further comprising:

an elevator arranged at a rear end of each of the preheating and defrosting chambers such that the elevator is vertically movable, and adapted to vertically move the test trays.

25. The handler according to claim 1, wherein the horizontal moving unit comprises:

guide rails arranged in the exchanging station to extend forwards and rearwards;

a pair of movable blocks which are movable along the guide rails, respectively;

a front holder mounted at opposite ends thereof to respective front ends of the movable blocks such that the front holder is movable forwards and rearwards, and adapted to hold a lower edge of the test tray received in the exchanging station;

a rear holder mounted at opposite ends thereof to respective rear ends of the movable blocks such that the rear holder is movable forwards and rearwards, and adapted to hold an upper edge of the test tray;

a plurality of pneumatic cylinders mounted to the movable blocks, and adapted to move the front and rear holders; and a linear driver for horizontally moving the movable blocks along the guide rails.

26. The handler according to claim 1, wherein each of the test trays comprises:

a carrier region where the carriers of the test tray are arranged, the carrier region corresponding to a test region of the test board occupied by the test sockets of the test board; and a carrier absent region where the carriers of the test tray are not arranged, the carrier absent region having a predetermined size and corresponding to a region of the test board other than the test region.

27. The handler according to claim 23, wherein each of the test trays comprises:

a carrier region where the carriers of the test tray are arranged, the carrier region corresponding to a test region of the test board occupied by the test sockets of the test board; and a carrier absent region where the carriers of the test tray are not arranged, the carrier absent region having a predetermined size and corresponding to a region of the test board other than the test region.

28. The handler according to claim 27, wherein the carrier absent region of each test tray supplied to an upper one of the two layers in the test chamber and the carrier absent region of each test tray supplied to a lower one of the two layers in the test chamber are arranged at different positions, respectively.

29. The handler according to claim 28, wherein the carrier region and carrier absent region of each test tray supplied to the upper layer in the test chamber are arranged opposite to the carrier region and carrier absent region of each test tray supplied to the lower layer in the test chamber.

30. The handler according to claim 29, wherein the carrier absent region of each test tray supplied to the upper layer in the test chamber is arranged at an upper portion of the upper-layer test tray, and the carrier absent region of each test tray supplied to the lower layer in the test chamber is arranged at a lower portion of the lower-layer test tray.

* * * * *